US010320339B2

(12) United States Patent
Leipold et al.

(10) Patent No.: US 10,320,339 B2
(45) Date of Patent: Jun. 11, 2019

(54) WEAKLY COUPLED BASED HARMONIC REJECTION FILTER FOR FEEDBACK LINEARIZATION POWER AMPLIFIER

(71) Applicant: Qorvo US, Inc., Greensboro, NC (US)

(72) Inventors: Dirk Robert Walter Leipold, San Jose, CA (US); George Maxim, Saratoga, CA (US); Baker Scott, San Jose, CA (US); Danny W. Chang, San Francisco, CA (US)

(73) Assignee: Qirvo US, Inc., Greensboro, NC (US)

( * ) Notice: Subject to any disclaimer, the term of this patent is extended or adjusted under 35 U.S.C. 154(b) by 0 days.

(21) Appl. No.: 15/972,917

(22) Filed: May 7, 2018

(65) Prior Publication Data

US 2018/0254755 A1    Sep. 6, 2018

Related U.S. Application Data

(62) Division of application No. 14/215,800, filed on Mar. 17, 2014, now Pat. No. 9,966,905.

(Continued)

(51) Int. Cl.
*H01F 27/28* (2006.01)
*H03F 1/32* (2006.01)
(Continued)

(52) U.S. Cl.
CPC .......... *H03F 1/3241* (2013.01); *H01F 27/28* (2013.01); *H01F 27/385* (2013.01); *H03F 1/32* (2013.01);
(Continued)

(58) Field of Classification Search
CPC ............................. H01F 5/00; H01F 27/00–36
(Continued)

(56) References Cited

U.S. PATENT DOCUMENTS

| 2,014,524 A | 9/1935 | Franz |
| 2,874,360 A | 2/1959 | Eisler |

(Continued)

FOREIGN PATENT DOCUMENTS

| EP | 0957368 A2 | 11/1999 |
| EP | 1184977 A2 | 3/2002 |

(Continued)

OTHER PUBLICATIONS

Non-Final Office Action for U.S. Appl. No. 15/961,299, dated Sep. 5, 2018, 10 pages.

(Continued)

*Primary Examiner* — Tuyen Nguyen
(74) *Attorney, Agent, or Firm* — Withrow & Terranova, P.L.L.C.

(57) ABSTRACT

Radio frequency (RF) filters configured to filter undesired signal components (e.g., noise and harmonics) from RF signals are disclosed. In one embodiment, an RF filter includes a first inductor coil having a first winding and a second inductor coil having a second winding and a third winding. The second winding of the second inductor coil is configured to have a first mutual magnetic coupling with the first winding, while the third winding of the second inductor coil is configured to have a second mutual magnetic coupling with the first winding. The second winding is connected to the third winding such that the first mutual magnetic coupling and the second mutual magnetic coupling are in opposition. In this manner, the first inductor coil and the second inductor coil may be provided in a compact arrangement while providing weak mutual magnetic coupling between the first inductor coil and the second inductor coil.

19 Claims, 15 Drawing Sheets

Related U.S. Application Data

(60) Provisional application No. 61/793,583, filed on Mar. 15, 2013, provisional application No. 61/789,508, filed on Mar. 15, 2013, provisional application No. 61/800,772, filed on Mar. 15, 2013, provisional application No. 61/800,991, filed on Mar. 15, 2013, provisional application No. 61/801,038, filed on Mar. 15, 2013, provisional application No. 61/946,270, filed on Feb. 28, 2014, provisional application No. 61/946,927, filed on Mar. 3, 2014.

(51) Int. Cl.

| | | |
|---|---|---|
| *H03F 3/195* | (2006.01) | |
| *H03F 3/21* | (2006.01) | |
| *H03F 3/19* | (2006.01) | |
| *H03F 3/213* | (2006.01) | |
| *H01F 27/38* | (2006.01) | |
| *H03H 7/09* | (2006.01) | |
| *H03H 7/01* | (2006.01) | |
| *H03F 1/34* | (2006.01) | |
| *H03F 1/22* | (2006.01) | |

(52) U.S. Cl.
 CPC ............... *H03F 3/19* (2013.01); *H03F 3/195* (2013.01); *H03F 3/211* (2013.01); *H03F 3/213* (2013.01); *H03H 7/09* (2013.01); *H03H 7/1775* (2013.01); *H03F 1/22* (2013.01); *H03F 1/34* (2013.01)

(58) Field of Classification Search
 USPC .... 336/65, 83, 180–184, 170, 173, 200, 232
 See application file for complete search history.

(56) References Cited

U.S. PATENT DOCUMENTS

| | | |
|---|---|---|
| 3,465,431 A | 9/1969 | Henning |
| 3,491,318 A | 1/1970 | Henning et al. |
| 3,597,709 A | 8/1971 | Rhodes |
| 3,718,874 A | 2/1973 | Cooper, Jr. |
| 3,794,941 A | 2/1974 | Templin |
| 4,296,440 A | 10/1981 | Rosenheck |
| 4,361,894 A | 11/1982 | Kurihara et al. |
| 4,484,345 A | 11/1984 | Stearns |
| 4,816,784 A * | 3/1989 | Rabjohn ............. H01F 27/2804 333/24 R |
| 4,894,566 A | 1/1990 | Rush |
| 5,150,901 A | 9/1992 | Stawicki |
| 5,296,831 A | 3/1994 | Suzuki |
| 5,339,017 A | 8/1994 | Yang |
| 5,517,083 A | 5/1996 | Whitlock |
| 5,608,363 A | 3/1997 | Cameron et al. |
| 5,661,414 A | 8/1997 | Shigehara et al. |
| 5,689,144 A | 11/1997 | Williams |
| 5,757,247 A | 5/1998 | Koukkari et al. |
| 5,841,330 A | 11/1998 | Wenzel et al. |
| 5,880,620 A | 3/1999 | Gitlin et al. |
| 5,896,073 A | 4/1999 | Miyazaki et al. |
| 5,963,557 A | 10/1999 | Eng |
| 6,215,374 B1 | 4/2001 | Petrovic |
| 6,233,438 B1 | 5/2001 | Wynn |
| 6,239,673 B1 | 5/2001 | Wenzel et al. |
| 6,529,750 B1 | 3/2003 | Zhang et al. |
| 6,664,873 B2 | 12/2003 | Tiihonen |
| 6,801,102 B2 | 10/2004 | Shamsaifar et al. |
| 7,015,870 B2 | 3/2006 | Guitton et al. |
| 7,116,186 B2 | 10/2006 | Chen |
| 7,164,339 B2 * | 1/2007 | Huang ................ H01F 17/0006 336/200 |
| 7,262,680 B2 | 8/2007 | Wang |
| 7,336,939 B2 | 2/2008 | Gomez |
| 7,573,350 B2 | 8/2009 | Frank |
| 7,652,532 B2 | 1/2010 | Li et al. |
| 7,733,207 B2 | 6/2010 | Yun et al. |
| 7,741,943 B2 | 6/2010 | Fouquet et al. |
| 7,795,995 B2 | 9/2010 | White et al. |
| 7,809,349 B1 | 10/2010 | Granger-Jones et al. |
| 7,825,751 B2 | 11/2010 | Kawaguchi et al. |
| 7,852,186 B2 | 12/2010 | Fouquet et al. |
| 7,917,106 B2 | 3/2011 | Drogi et al. |
| 7,970,360 B2 | 6/2011 | Pei |
| 7,973,633 B2 | 7/2011 | Noma et al. |
| 8,013,674 B2 | 9/2011 | Drogi et al. |
| 8,103,233 B2 | 1/2012 | Im et al. |
| 8,126,409 B2 | 2/2012 | Osman et al. |
| 8,175,551 B2 | 5/2012 | Akaiwa |
| 8,193,781 B2 | 6/2012 | Lin et al. |
| 8,204,446 B2 | 6/2012 | Scheer et al. |
| 8,258,911 B2 | 9/2012 | Fouquet |
| 8,269,575 B2 * | 9/2012 | Frye ................... H01L 23/5223 333/238 |
| 8,314,653 B1 | 11/2012 | Granger-Jones et al. |
| 8,344,806 B1 | 1/2013 | Franck et al. |
| 8,346,179 B2 | 1/2013 | Brunn et al. |
| 8,369,250 B1 | 2/2013 | Khlat |
| 8,400,232 B2 * | 3/2013 | Leong ....................... H01P 5/10 333/25 |
| 8,410,846 B2 | 4/2013 | Zare-Hoseini |
| 8,620,233 B2 | 12/2013 | Brobston |
| 8,624,678 B2 | 1/2014 | Scott et al. |
| 8,626,083 B2 | 1/2014 | Greene et al. |
| 8,653,888 B2 | 2/2014 | Watanabe |
| 8,653,890 B2 | 2/2014 | Ahmed et al. |
| 8,736,511 B2 | 5/2014 | Morris, III |
| 8,742,871 B2 | 6/2014 | Jin et al. |
| 8,749,310 B2 | 6/2014 | Hayes |
| 8,751,993 B1 | 6/2014 | Fenzi et al. |
| 8,791,769 B2 | 7/2014 | Leong et al. |
| 8,803,632 B2 | 8/2014 | Takeuchi |
| 8,803,634 B2 | 8/2014 | Hanaoka |
| 8,829,995 B2 | 9/2014 | Cohen |
| 8,841,983 B2 | 9/2014 | Newton et al. |
| 8,862,089 B2 | 10/2014 | Wang et al. |
| 8,884,714 B2 | 11/2014 | Carey et al. |
| 8,977,216 B2 | 3/2015 | Weissman et al. |
| 9,002,309 B2 | 4/2015 | Sahota et al. |
| 9,054,648 B1 | 6/2015 | Xu |
| 9,094,104 B2 | 7/2015 | Din et al. |
| 9,124,355 B2 | 9/2015 | Black et al. |
| 9,196,406 B2 | 11/2015 | Leipold et al. |
| 9,203,455 B2 | 12/2015 | Yang et al. |
| 9,369,162 B2 | 6/2016 | Lo et al. |
| 9,391,650 B2 | 7/2016 | Kparin |
| 9,444,417 B2 | 9/2016 | Maxim et al. |
| 9,608,595 B1 | 3/2017 | Raihn et al. |
| 9,628,045 B2 | 4/2017 | Leipold et al. |
| 9,698,751 B2 | 7/2017 | Leipold et al. |
| 2001/0020877 A1 | 9/2001 | Hasegawa et al. |
| 2002/0057139 A1 | 5/2002 | Matsumura et al. |
| 2002/0095778 A1 | 7/2002 | Ahn et al. |
| 2002/0186378 A1 | 12/2002 | Tazartes et al. |
| 2002/0190795 A1 | 12/2002 | Hoang |
| 2003/0008577 A1 | 1/2003 | Quigley et al. |
| 2003/0008628 A1 | 1/2003 | Lindell et al. |
| 2003/0128084 A1 | 7/2003 | Chang et al. |
| 2003/0151409 A1 | 8/2003 | Marek |
| 2003/0155988 A1 | 8/2003 | Douziech et al. |
| 2003/0222732 A1 | 12/2003 | Matthaei |
| 2004/0121741 A1 | 6/2004 | Rashev et al. |
| 2004/0127178 A1 | 7/2004 | Kuffner |
| 2004/0130414 A1 | 7/2004 | Marquardt et al. |
| 2004/0162042 A1 | 8/2004 | Chen et al. |
| 2004/0182602 A1 * | 9/2004 | Satoh .................. H01F 17/0006 174/258 |
| 2004/0196085 A1 | 10/2004 | Shen |
| 2004/0222868 A1 | 11/2004 | Rattigeber et al. |
| 2004/0227578 A1 | 11/2004 | Hamalainen |
| 2004/0266378 A1 | 12/2004 | Fukamachi et al. |
| 2005/0123064 A1 | 6/2005 | Ben-Ayun et al. |
| 2005/0150106 A1 | 7/2005 | Long et al. |
| 2005/0195063 A1 | 9/2005 | Mattsson |
| 2005/0237144 A1 | 10/2005 | Einzinger et al. |

(56) References Cited

U.S. PATENT DOCUMENTS

| | | |
|---|---|---|
| 2006/0033602 A1 | 2/2006 | Mattsson |
| 2006/0035600 A1 | 2/2006 | Lee et al. |
| 2006/0038635 A1 | 2/2006 | Richiuso et al. |
| 2006/0058629 A1 | 3/2006 | Warntjes et al. |
| 2006/0109064 A1 | 5/2006 | Toncich et al. |
| 2006/0125465 A1 | 6/2006 | Xiang et al. |
| 2006/0176135 A1 | 8/2006 | Winter et al. |
| 2006/0220727 A1 | 10/2006 | Yen |
| 2006/0226943 A1 | 10/2006 | Marques |
| 2006/0261890 A1 | 11/2006 | Floyd et al. |
| 2006/0281431 A1 | 12/2006 | Isaac et al. |
| 2007/0085648 A1 | 4/2007 | Lee et al. |
| 2007/0091006 A1 | 4/2007 | Thober et al. |
| 2007/0161361 A1 | 7/2007 | Vaisanen et al. |
| 2007/0182520 A1 | 8/2007 | Kawakubo et al. |
| 2007/0194859 A1 | 8/2007 | Brobston et al. |
| 2007/0241839 A1 | 10/2007 | Taniguchi |
| 2007/0290767 A1 | 12/2007 | Ali-Ahmad et al. |
| 2008/0002380 A1 | 1/2008 | Hazucha et al. |
| 2008/0096516 A1 | 4/2008 | Mun et al. |
| 2008/0099884 A1 | 5/2008 | Inohara |
| 2008/0122560 A1 | 5/2008 | Liu |
| 2008/0164967 A1 | 7/2008 | Mashing |
| 2008/0220735 A1 | 9/2008 | Kim et al. |
| 2008/0297299 A1 | 12/2008 | Yun et al. |
| 2008/0303623 A1 | 12/2008 | Hsu et al. |
| 2009/0058589 A1 | 3/2009 | Chen et al. |
| 2009/0088110 A1 | 4/2009 | Schuur et al. |
| 2009/0134947 A1 | 5/2009 | Tarng |
| 2009/0134953 A1 | 5/2009 | Hunt et al. |
| 2009/0261936 A1 | 10/2009 | Widjaja et al. |
| 2009/0289721 A1 | 11/2009 | Rajendran et al. |
| 2009/0309661 A1 | 12/2009 | Chang et al. |
| 2010/0013562 A1 | 1/2010 | Stockinger et al. |
| 2010/0060354 A1 | 3/2010 | Maeda |
| 2010/0144305 A1 | 6/2010 | Cook et al. |
| 2010/0188171 A1 | 7/2010 | Mohajer-Iravani et al. |
| 2010/0283557 A1 | 11/2010 | Taniguchi |
| 2011/0010749 A1 | 1/2011 | Alkan |
| 2011/0103494 A1 | 5/2011 | Ahmadi |
| 2011/0156835 A1 | 6/2011 | Nagai |
| 2011/0159834 A1 | 6/2011 | Salvi |
| 2011/0163824 A1 | 7/2011 | Kawano |
| 2011/0169589 A1 | 7/2011 | Franzon et al. |
| 2011/0210787 A1 | 9/2011 | Lee et al. |
| 2011/0241163 A1 | 10/2011 | Liu et al. |
| 2012/0051409 A1 | 3/2012 | Brobston et al. |
| 2012/0081192 A1 | 4/2012 | Hanaoka |
| 2012/0230227 A1 | 9/2012 | Weiss |
| 2012/0249266 A1 | 10/2012 | Lim et al. |
| 2012/0262252 A1 | 10/2012 | Tseng et al. |
| 2012/0268229 A1 | 10/2012 | Yen et al. |
| 2012/0286900 A1 | 11/2012 | Kadota et al. |
| 2013/0049902 A1 | 2/2013 | Hendry et al. |
| 2013/0143381 A1 | 6/2013 | Kikukawa |
| 2013/0244591 A1 | 9/2013 | Weissman et al. |
| 2013/0257564 A1 | 10/2013 | Huang et al. |
| 2013/0281031 A1 | 10/2013 | Gingrich et al. |
| 2013/0295863 A1 | 11/2013 | Shanan |
| 2014/0015603 A1 | 1/2014 | Scott et al. |
| 2014/0035358 A1 | 2/2014 | Ichikawa |
| 2014/0106698 A1 | 4/2014 | Mi et al. |
| 2014/0113573 A1 | 4/2014 | Khatri et al. |
| 2014/0133189 A1 | 5/2014 | Worek |
| 2014/0141738 A1 | 5/2014 | Janesch |
| 2014/0146737 A1 | 5/2014 | Ohshima et al. |
| 2014/0162712 A1 | 6/2014 | Feld et al. |
| 2014/0167877 A1 | 6/2014 | Shimizu et al. |
| 2014/0192845 A1 | 7/2014 | Szini et al. |
| 2014/0225680 A1 | 8/2014 | Fujiwara et al. |
| 2014/0232467 A1 | 8/2014 | Mukai et al. |
| 2014/0266432 A1 | 9/2014 | Scott et al. |
| 2014/0266451 A1 | 9/2014 | Scott et al. |
| 2014/0266452 A1 | 9/2014 | Scott et al. |
| 2014/0266457 A1 | 9/2014 | Scott et al. |
| 2014/0266458 A1 | 9/2014 | Scott et al. |
| 2014/0266459 A1 | 9/2014 | Scott et al. |
| 2014/0266531 A1 | 9/2014 | Leipold et al. |
| 2014/0266544 A1 | 9/2014 | Leipold et al. |
| 2014/0285286 A1 | 9/2014 | Bojer |
| 2014/0323046 A1 | 10/2014 | Asai et al. |
| 2014/0323071 A1 | 10/2014 | Liao |
| 2014/0328220 A1 | 11/2014 | Khlat et al. |
| 2014/0361848 A1 | 12/2014 | Leipold et al. |
| 2014/0361849 A1 | 12/2014 | Maxim et al. |
| 2014/0361852 A1 | 12/2014 | Leipold et al. |
| 2014/0364077 A1 | 12/2014 | Maxim et al. |
| 2015/0001708 A1 | 1/2015 | Lin |
| 2015/0002240 A1 | 1/2015 | Reiha |
| 2015/0035612 A1 | 2/2015 | Maxim et al. |
| 2015/0035617 A1 | 2/2015 | Leipold et al. |
| 2015/0035622 A1 | 2/2015 | Maxim et al. |
| 2015/0035637 A1 | 2/2015 | Maxim et al. |
| 2015/0038094 A1 | 2/2015 | Maxim et al. |
| 2015/0038101 A1 | 2/2015 | Maxim et al. |
| 2015/0042399 A1 | 2/2015 | Imbornone et al. |
| 2015/0054582 A1 | 2/2015 | Goss |
| 2015/0056939 A1 | 2/2015 | Ong et al. |
| 2015/0061680 A1 | 3/2015 | Leskowitz |
| 2015/0065070 A1 | 3/2015 | Maxim et al. |
| 2015/0084699 A1 | 3/2015 | Maxim et al. |
| 2015/0084713 A1 | 3/2015 | Maxim et al. |
| 2015/0084718 A1 | 3/2015 | Maxim et al. |
| 2015/0092625 A1 | 4/2015 | Leipold et al. |
| 2015/0094008 A1 | 4/2015 | Maxim et al. |
| 2015/0102887 A1 | 4/2015 | Park |
| 2015/0116950 A1 | 4/2015 | Yoo et al. |
| 2015/0117280 A1 | 4/2015 | Khlat et al. |
| 2015/0117281 A1 | 4/2015 | Khlat et al. |
| 2015/0226950 A1 | 8/2015 | Booth et al. |
| 2016/0126613 A1 | 5/2016 | Leipold et al. |
| 2016/0126623 A1 | 5/2016 | Maxim et al. |
| 2016/0359510 A1 | 12/2016 | Scott et al. |
| 2016/0359511 A1 | 12/2016 | Maxim et al. |
| 2017/0062119 A1 | 3/2017 | Zybura et al. |
| 2017/0084991 A1 | 3/2017 | Mayo |
| 2017/0134058 A1 | 5/2017 | Leipold et al. |

FOREIGN PATENT DOCUMENTS

| | | |
|---|---|---|
| JP | 06082539 A | 3/1994 |
| JP | 07015253 A | 1/1995 |
| JP | 2010141827 A | 6/2010 |
| KR | 100812098 B1 | 3/2008 |
| KR | 20110114238 A | 10/2011 |
| WO | 0146971 A1 | 6/2001 |
| WO | 2005117255 A1 | 12/2005 |

OTHER PUBLICATIONS

Non-Final Office Action for U.S. Appl. No. 15/208,780, dated Oct. 22, 2018, 7 pages.

Idris, D., et al., "Design and Implementation of Self-Calibration for Digital Predistortion of Power Amplifiers," WSEAS Transactions on Circuits and Systems, vol. 7, No. 2, Feb. 2008, pp. 75-84.

Keerti, Arvind, et al., "RF Characterization of SiGe HBT Power Amplifiers under Load Mismatch," IEEE Transactions on Microwave Theory and Techniques, vol. 55, No. 2, Feb. 2007, pp. 207-214.

Kim, Jangheon et al., "Analysis of Adaptive Digital Feedback Linearization Techniques," IEEE Transactions on Circuits and Systems—1: Regular Papers, vol. 57, No. 2, Feb. 2010, pp. 345-354.

Ko, Sangwon, et al., "A Linearized Cascode CMOS Power Amplifier," IEEE Annual Wireless and Microwave Technology Conference, WAMICON '06, Dec. 4-6, 2006, Clearwater Beach, Florida, 4 pages.

Liu, Jenny Yi-Chun, et al., "Millimeter-Wave Self-Healing Power Amplifier with Adaptive Amplitude and Phase Linearization in 65-nm CMOS," IEEE Transactions on Microwave Theory and Techniques, vol. 60, No. 5, May 2012, pp. 1342-1352.

Mu, Xiaofang, et al., "Analysis of Output Power Variation under Mismatched Load in Power Amplifier FEM with Directional Cou-

(56) References Cited

OTHER PUBLICATIONS pler," IEEE MTT-S International Microwave Symposium Digest, Jun. 7-12, 2009, Boston, Mass., pp. 549-552.
Nakayama, Masatoshi, et al., "A Novel Amplitude and Phase Linearizing Technique for Microwave Power Amplifiers," IEEE MTT-S International Microwave Symposium Digest, vol. 3, May 16-20, 1995, Orlando, Fla., pp. 1451-1454.
Peng, Zhan, et al., "RF Power Amplifier Linearization Method Based on Quadrature Nonlinear Model," 1st International Conference on Information Science and Engineering, Dec. 26-28, 2009, Nanjing, China, pp. 2711-2713.
Rachakonda, Anil, et al., "Log Amps and Directional Couplers Enable VSWR Detection," RF Design Magazine, Jan. 2007, pp. 28-34.
Scuderi, Antonino, et al., "A VSWR-Rugged Silicon Bipolar RF Power Amplifier," Proceedings of the Bipolar/BiCMOS Circuits and Technology Meeting, Oct. 9-11, 2005, pp. 116-119.
So, Jinhyun, et al., "Digital Predistortion Based on Envelope Feedback," IEEE International Conference on Acoustics, Speech and Signal Processing (ICASSP), Mar. 25-30, 2012, Kyoto, Japan, pp. 3169-3172.
Woo, Wangmyong, et al., "A New Envelope Predistortion Linearization Architecture for Handset Power Amplifiers," IEEE Radio and Wireless Conference, Sep. 19-22, 2004, pp. 175-178.
Zhang, X., et al., "Gain/Phase Imbalance-Minimization Techniques for LINC Transmitters," IEEE Transactions on Microwave Theory and Techniques, vol. 49, No. 12, Dec. 2001, pp. 2507-2516.
Non-Final Office Action for U.S. Appl. No. 14/215,815, dated May 4, 2015, 13 pages.
Notice of Allowance for U.S. Appl. No. 14/215,815, dated Oct. 1, 2015, 7 pages.
Non-Final Office Action for U.S. Appl. No. 14/216,376, dated May 7, 2015, 8 pages.
Notice of Allowance for U.S. Appl. No. 14/216,376, dated Feb. 22, 2016, 10 pages.
Non-Final Office Action for U.S. Appl. No. 14/216,794, dated Jun. 30, 2015, 5 pages.
Notice of Allowance for U.S. Appl. No. 14/216,794, dated Nov. 24, 2015, 7 pages.
Non-Final Office Action for U.S. Appl. No. 14/217,199, dated Jul. 2, 2015, 6 pages.
Final Office Action for U.S. Appl. No. 14/217,199, dated Oct. 19, 2015, 5 pages.
Non-Final Office Action for U.S. Appl. No. 14/217,199, dated Feb. 4, 2016, 5 pages.
Final Office Action for U.S. Appl. No. 14/217,199, dated Jul. 7, 2016, 5 pages.
Advisory Action for U.S. Appl. No. 14/217,199, dated Oct. 17, 2016, 2 pages.
Non-Final Office Action for U.S. Appl. No. 14/217,199, dated Nov. 23, 2016, 6 pages.
Notice of Allowance for U.S. Appl. No. 14/217,199, dated Apr. 4, 2017, 6 pages.
Non-Final Office Action for U.S. Appl. No. 14/216,560, dated Jul. 16, 2015, 9 pages.
Non-Final Office Action for U.S. Appl. No. 14/216,560, dated Feb. 2, 2016, 9 pages.
Non-Final Office Action for U.S. Appl. No. 14/216,560, dated Aug. 16, 2016, 8 pages.
Notice of Allowance for U.S. Appl. No. 14/216,560, dated Apr. 20, 2017, 9 pages.
Non-Final Office Action for U.S. Appl. No. 14/218,953, dated Jul. 24, 2015, 10 pages.
Final Office Action for U.S. Appl. No. 14/218,953, dated Jan. 4, 2016, 11 pages.
Notice of Allowance for U.S. Appl. No. 14/218,953, dated May 2, 2016, 5 pages.
Non-Final Office Action for U.S. Appl. No. 14/450,204, dated Feb. 1, 2017, 9 pages.
Notice of Allowance and Examiner-Initiated Interview Summary for U.S. Appl. No. 14/450,200, dated Feb. 10, 2017, 8 pages.
Non-Final Office Action for U.S. Appl. No. 14/555,557, dated Feb. 13, 2017, 21 pages.
Non-Final Office Action for U.S. Appl. No. 14/554,975, dated Feb. 16, 2017, 9 pages.
Notice of Allowance for U.S. Appl. No. 15/223,416, dated Feb. 28, 2017, 8 pages.
Non-Final Office Action for U.S. Appl. No. 15/240,420, dated Jan. 26, 2017, 7 pages.
Non-Final Office Action for U.S. Appl. No. 15/241,823, dated Jan. 17, 2017, 6 pages.
Final Office Action for U.S. Appl. No. 14/449,764, dated Mar. 2, 2017, 10 pages.
Corrected Notice of Allowability for U.S. Appl. No. 14/450,200, dated Mar. 1, 2017, 3 pages.
Advisory Action for U.S. Appl. No. 14/215,800, dated Apr. 20, 2017, 2 pages.
Notice of Allowance for U.S. Appl. No. 14/298,863, dated May 31, 2017, 6 pages.
Final Office Action for U.S. Appl. No. 14/450,156, dated Apr. 27, 2017, 12 pages.
Notice of Allowance for U.S. Appl. No. 14/450,028, dated May 3, 2017, 5 pages.
Notice of Allowance and Examiner-Initiated Interview Summary for U.S. Appl. No. 14/449,764, dated May 19, 2017, 8 pages.
Notice of Allowance for U.S. Appl. No. 14/450,204, dated Jun. 28, 2017, 8 pages.
Notice of Allowance for U.S. Appl. No. 14/555,371, dated Mar. 31, 2017, 8 pages.
Notice of Allowance and Examiner-Initiated Inteview Summary for U.S. Appl. No. 14/554,975, dated Jul. 17, 2017, 9 pages.
Notice of Allowance for U.S. Appl. No. 15/240,420, dated May 10, 2017, 8 pages.
Notice of Allowance for U.S. Appl. No. 15/241,823, dated May 9, 2017, 7 pages.
Non-Final Office Action for U.S. Appl. No. 15/587,581, dated Jun. 30, 2017, 6 pages.
Non-Final Office Action for U.S. Appl. No. 15/415,538, dated Jul. 17, 2017, 18 pages.
Non-Final Office Action for U.S. Appl. No. 14/215,800, dated Aug. 15, 2017, 6 pages.
Notice of Allowance for U.S. Appl. No. 14/450,156, dated Oct. 11, 2017, 10 pages.
Supplemental Notice of Allowability for U.S. Appl. No. 14/450,204, dated Aug. 28, 2017, 5 pages.
Notice of Allowance for U.S. Appl. No. 14/554,943, dated Aug. 31, 2017, 7 pages.
Advisory Action for U.S. Appl. No. 14/555,557, dated Nov. 3, 2017, 3 pages.
Final Office Action for U.S. Appl. No. 14/555,557, dated Aug. 7, 2017, 21 pages.
Duplessis, M., et al., "Physical implementation of 3D integrated solenoids within silicon substrate for hybrid IC applications," presented at the European Microwave Conference, Sep. 29-Oct. 1, 2009, Rome, IEEE, pp. 1006-1009.
Invitation to Pay Additional Fees for PCT/US2014/030188, dated Jul. 4, 2014, 8 pages.
International Search Report and Written Opinion for PCT/US2014/030188, dated Sep. 5, 2014, 19 pages.
International Preliminary Report on Patentability for PCT/US2014/030188, dated Sep. 24, 2015, 13 pages.
Non-Final Office Action for U.S. Appl. No. 14/099,007, dated Oct. 30, 2014, 10 pages.
Final Office Action for U.S. Appl. No. 14/099,007, dated Mar. 4, 2015, 14 pages.
Notice of Allowance for U.S. Appl. No. 14/099,007, dated Jul. 22, 2015, 9 pages.
Non-Final Office Action for U.S. Appl. No. 14/450,156, dated Sep. 9, 2015, 13 pages.
Notice of Allowance for U.S. Appl. No. 14/215,800, dated Jan. 9, 2018, 8 pages.

(56) References Cited

OTHER PUBLICATIONS

Notice of Allowance for U.S. Appl. No. 15/587,581, dated Dec. 8, 2017, 7 pages.
Bogya, Robert I., et al., "Linear Radio Frequency Power Amplifier Design Using Nonlinear Feedback Linearization Techniques," presented at the 60th Vehicular Technology Conference, vol. 3, Sep. 26-29, 2004, IEEE, pp. 2259-2263.
Brounley, Richard W., "Matching Networks for Power Amplifiers Operating into High VSWR Loads," High Frequency Electronics, May 2004, pp. 58-62.
Charles, C.T., "A Calibrated Phase and Amplitude Control System for a 1.9 GHz Phased-Array Transmitter Element," IEEE Transactions on Circuits and Systems 1: Regular Papers, vol. 56, No. 12, Dec. 2009, pp. 2728-2737.
Chen, Wei, et al., "A Novel VSWR-Protected and Controllable CMOS Class E Power Amplifier for Bluetooth Applications," International Journal of Design, Analysis and Tools for Circuits and Systems, vol. 1, No. 1, Jun. 2011, pp. 22-26.
D'Andrea, Aldo N., et al., "RF Power Amplifier Linearization through Amplitude and Phase Predistortion," IEEE Transactions on Communications, vol. 44, No. 11, Nov. 1996, pp. 1477-1484.
Dawson, J., et al., "Automatic Phase Alignment for a Fully Integrated Cartesian Feedback Power Amplifier System," IEEE Journal of Solid-State Circuits, vol. 38, No. 12, Dec. 2003, pp. 2269-2279.
Dawson, Joel L., "Feedback Linearization of RF Power Amplifiers," Dissertation for Stanford University, Stanford, Calif., Aug. 2003, 191 pages.
Delaunay, Nicolas, et al., "Linearization of a 65nm CMOS Power Amplifier with a Cartesian Feedback for W-CDMA Standard," Joint IEEE North-East Workshop on Circuits and Systems and TAISA Conference, Jun. 28-Jul. 1, 2009, Toulouse, France, 4 pages.
Do, Ji-Hoon, et al., "W-CDMA High Power Amplifier Using Anti-Phase Intermodulation Distortion Linearization Technology," Asia-Pacific Microwave Conference, Dec. 11-14, 2007, Bangkok, Thailand, 4 pages.
Hoppenjans, Eric E., et al., "A Vertically Integrated Tunable UHF Filter," 2010 IEEE MTT-S International Microwave Symposium Digest (MTT), May 23-28, 2010, Anaheim, Calif., pp. 1380-1383.
Hu, Q.Z., et al., "A SiGe Power Amplifier with Power Detector and VSWR Protection for TD-SCDMA Application," Proceedings of the International Conference on Mixed Design of Integrated Circuits and Systems, Jun. 22-24, 2006, Gdynia, Poland, pp. 214-217.
Hur, J., et al., "An Amplitude and Phase Mismatches Calibration Technique for the LINC Transmitter with Unbalanced Phase Control," IEEE Transactions on Vehicular Technology, vol. 60, No. 9, Nov. 2011, pp. 4184-4193.
Hoppenjans, Eric E. et al., "A Vertically Integrated Tunable UHF Filter," International Microwave Symposium Digest (MTT), May 23-28, 2010, Anaheim, California, IEEE, pp. 1380-1383.
Joshi, H. et al., "Tunable high Q narrow-band triplexer," IEEE MTT-S International Microwave Symposium Digest, Jun. 7-12, 2009, Boston, MA, IEEE, pp. 1477-1480.
Kamali-Sarvestani, Reza et al., "Fabrication of High Quality Factor RF-Resonator Using Embedded Inductor and Via Capacitor," IECON 2010—36th Annual Conference on IEEE Industrial Electronics Society, Nov. 7-10, 2010, Glendale, Arizona, IEEE, pp. 2283-2287.
International Search Report and Written Opinion for PCT/US2014/030431, dated Jun. 20, 2014, 14 pages.
International Preliminary Report on Patentability for PCT/US/2014/030431, dated Sep. 24, 2015, 10 pages.
Non-Final Office Action for U.S. Appl. No. 14/215,800, dated Nov. 20, 2015, 5 pages.
Final Office Action for U.S. Appl. No. 14/215,800, dated Mar. 11, 2016, 6 pages.
Non-Final Office Action for U.S. Appl. No. 14/215,800, dated Aug. 11, 2016, 6 pages.
Invitation to Pay Additional Fees and, Where Applicable, Protest Fee for PCT/US2014/048608, dated Oct. 21, 2014, 7 pages.
International Search Report and Written Opinion for PCT/US2014/048608, dated Dec. 16, 2014, 18 pages.
International Preliminary Report on Patentability for PCT/US2014/048608, dated Feb. 11, 2016, 14 pages.
Non-Final Office Action for U.S. Appl. No. 14/298,829, dated Jun. 22, 2015, 8 pages.
Final Office Action for U.S. Appl. No. 14/298,829, dated Feb. 3, 2016, 10 pages.
Notice of Allowance for U.S. Appl. No. 14/298,829, dated May 20, 2016, 9 pages.
Non-Final Office Action for U.S. Appl. No. 14/298,830, dated Dec. 3, 2015, 10 pages.
Notice of Allowance for U.S. Appl. No. 14/298,830, dated Apr. 7, 2016, 9 pages.
Non-Final Office Action for U.S. Appl. No. 14/298,863, dated Jan. 7, 2016, 16 pages.
Final Office Action for U.S. Appl. No. 14/298,863, dated Jun. 3, 2016, 17 pages.
Non-Final Office Action for U.S. Appl. No. 14/449,913, dated Mar. 28, 2016, 15 pages.
Final Office Action for U.S. Appl. No. 14/449,913, dated Sep. 7, 2016, 14 pages.
Non-Final Office Action for U.S. Appl. No. 14/298,852, dated Dec. 22, 2015, 7 pages.
Notice of Allowance for U.S. Appl. No. 14/298,852, dated May 13, 2016, 9 pages.
Notice of Allowance for U.S. Appl. No. 14/298,852, dated Jul. 13, 2016, 9 pages.
Non-Final Office Action for U.S. Appl. No. 14/450,156, dated Mar. 14, 2016, 11 pages.
Non-Final Office Action for U.S. Appl. No. 14/450,156, dated Sep. 15, 2016, 11 pages.
Non-Final Office Action for U.S. Appl. No. 14/450,028, dated Dec. 10, 2015, 11 pages.
Final Office Action for U.S. Appl. No. 14/450,028, dated Mar. 31, 2016, 12 pages.
Advisory Action for U.S. Appl. No. 14/450,028, dated Aug. 2, 2016, 3 pages.
Non-Final Office Action for U.S. Appl. No. 14/449,764, dated May 4, 2016, 12 pages.
Non-Final Office Action for U.S. Appl. No. 14/450,199, dated Apr. 20, 2016, 7 pages.
Notice of Allowance for U.S. Appl. No. 14/450,199, dated Aug. 1, 2016, 7 pages.
Non-Final Office Action for U.S. Appl. No. 14/450,204, dated Apr. 22, 2016, 8 pages.
Non-Final Office Action for U.S. Appl. No. 14/555,053, dated Dec. 31, 2015, 5 pages.
Notice of Allowance for U.S. Appl. No. 14/555,053, dated Apr. 19, 2016, 7 pages.
Non-Final Office Action for U.S. Appl. No. 14/450,200, dated Feb. 29, 2016, 13 pages.
Final Office Action for U.S. Appl. No. 14/450,200, dated Jun. 14, 2016, 13 pages.
Non-Final Office Action for U.S. Appl. No. 14/450,200, dated Sep. 8, 2016, 14 pages.
Non-Final Office Action for U.S. Appl. No. 14/554,943, dated Jun. 30, 2016, 14 pages.
Non-Final Office Action for U.S. Appl. No. 14/555,557, dated Jun. 13, 2016, 28 pages.
Non-Final Office Action for U.S. Appl. No. 14/298,863, dated Sep. 26, 2016, 9 pages.
Non-Final Office Action for U.S. Appl. No. 14/450,028, dated Sep. 26, 2016, 14 pages.
Non-Final Office Action for U.S. Appl. No. 14/449,764, dated Oct. 17, 2016, 10 pages.
Final Office Action for U.S. Appl. No. 14/555,557, dated Sep. 20, 2016, 23 pages.
Non-Final Office Action for U.S. Appl. No. 14/553,371, dated Oct. 25, 2016, 19 pages.
Notice of Allowance for U.S. Appl. No. 14/449,913, dated Dec. 7, 2016, 7 pages.
Notice of Allowance and Examiner-Initiated Interview Summary for U.S. Appl. No. 14/554,943, dated Nov. 16, 2016, 8 pages.

(56) References Cited

OTHER PUBLICATIONS

Notice of Allowance for U.S. Appl. No. 15/223,416, dated Dec. 2, 2016, 8 pages.
Final Office Action for U.S. Appl. No. 14/215,800, dated Feb. 8, 2017, 7 pages.
Final Office Action for U.S. Appl. No. 14/298,863, dated Feb. 14, 2017, 10 pages.
Final Office Action for U.S. Appl. No. 14/450,028, dated Jan. 19, 2017, 12 pages.
Final Office Action for U.S. Patent Application No. 15/961,299, mailed Mar. 5, 2019, 11 pages.
Non-Final Office Action for U.S. Patent Application No. 15/717,525, mailed Mar. 4, 2019, 10 pages.
Final Office Action for U.S. Patent Application No. 15/208,780, mailed Mar. 7, 2019, 9 pages.

\* cited by examiner

US 10,320,339 B2

WEAKLY COUPLED BASED HARMONIC REJECTION FILTER FOR FEEDBACK LINEARIZATION POWER AMPLIFIER

RELATED APPLICATIONS

The present application is a Divisional of U.S. utility patent application Ser. No. 14/215,800, filed Mar. 17, 2014, now U.S. Pat. No. 9,966,905, which claims the benefit of and priority to U.S. Provisional Patent Application No. 61/793,583, filed Mar. 15, 2013; U.S. Provisional Patent Application No. 61/789,508, filed Mar. 15, 2013; U.S. Provisional Patent Application No. 61/800,772, filed Mar. 15, 2013; U.S. Provisional Patent Application No. 61/800,991, filed Mar. 15, 2013; U.S. Provisional Patent Application No. 61/801,038, filed Mar. 15, 2013; U.S. Provisional Patent Application No. 61/946,270, filed Feb. 28, 2014; and U.S. Provisional Patent Application No. 61/946,927, filed Mar. 3, 2014.

The present application is related to U.S. Pat. No. 9,294,045, entitled "GAIN AND PHASE CALIBRATION FOR CLOSED LOOP FEEDBACK LINEARIZED AMPLIFIERS"; U.S. Pat. No. 9,742,359, entitled "POWER AMPLIFIER WITH WIDE DYNAMIC RANGE AM FEEDBACK LINEARIZATION SCHEME"; U.S. Pat. No. 9,294,046, entitled "RF POWER AMPLIFIER WITH PM FEEDBACK LINEARIZATION"; U.S. Pat. No. 9,444,411, entitled "RF POWER AMPLIFIER WITH TOTAL RADIATED POWER STABILIZATION"; U.S. Pat. No. 9,391,565, entitled "AMPLIFIER PHASE DISTORTION CORRECTION BASED ON AMPLITUDE DISTORTION MEASUREMENT"; and U.S. Pat. No. 9,748,905, entitled "RF REPLICATOR FOR ACCURATE MODULATED AMPLITUDE AND PHASE MEASUREMENT."

All of the patents and applications listed above are incorporated herein by reference in their entireties.

FIELD OF THE DISCLOSURE

This disclosure relates generally to radio frequency (RF) amplification devices and methods of operating the same.

BACKGROUND

Radio frequency (RF) filters are often used in RF amplification devices to filter undesired signal components (e.g., harmonics and noise) from RF signals. For example, an RF amplification device may include a closed-loop control system that stabilizes the performance of the RF amplification device. An RF signal may be received as feedback and reference signals by the closed-loop control system in order to linearize the performance of the RF amplification device. An RF filter, such as a harmonic filter, may be used to filter harmonics from the RF signal in order to maintain the operation of the closed-loop control system. However, typical RF filters offer a hard tradeoff between harmonic rejection, bandwidth, and filter order. This constitutes a hard barrier for the use of closed-loop control circuits with RF amplification devices since the down-converted harmonics may result in linearization error, thereby causing distortion. Furthermore, reference and feedback paths in the closed-loop control circuits may suffer from degradation due to broadband noise. For instance, the broadband noise may be down-converted and folded on top of signals in the reference and feedback paths, resulting in degraded signal-to-noise ratios (SNRs). RF filters with weak mutually magnetically coupled inductor coils improve performance and have higher quality (Q) factors. Unfortunately, traditional weakly mutually magnetically coupled inductor coils consume large amounts of area, since the inductor coils must be placed a large distance apart (e.g., a distance several times greater than a diameter of the inductor coils) in order to obtain weak mutual magnetic coupling. Thus, more compact weakly magnetically coupled inductor structures are needed for RF filters.

SUMMARY

This disclosure relates generally to radio frequency (RF) amplification devices and methods of operating the same. More specifically, the RF amplification devices may include RF filters to filter undesired signal components (e.g., noise and harmonics) from RF signals. In one embodiment, an RF filter includes a first inductor coil having a first winding and a second inductor coil having a second winding and a third winding. Note that the first winding, the second winding, and the third winding may not be the only windings and the first inductor coil and the second inductor coil may also have any number of additional windings. With regard to the mutual magnetic coupling between the first inductor coil and the second inductor coil, the second winding of the second inductor coil is configured to have a first mutual magnetic coupling with the first winding of the first inductor coil. The third winding of the second inductor coil is configured to have a second mutual magnetic coupling with the first winding of the first inductor coil. However, the second winding is connected to the third winding such that the first mutual magnetic coupling and the second mutual magnetic coupling are in opposition. By having the first mutual magnetic coupling and the second mutual magnetic coupling in opposition, the first inductor coil and the second inductor coil may be provided in a compact arrangement while providing weak mutual magnetic coupling between the first inductor coil and the second inductor coil.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
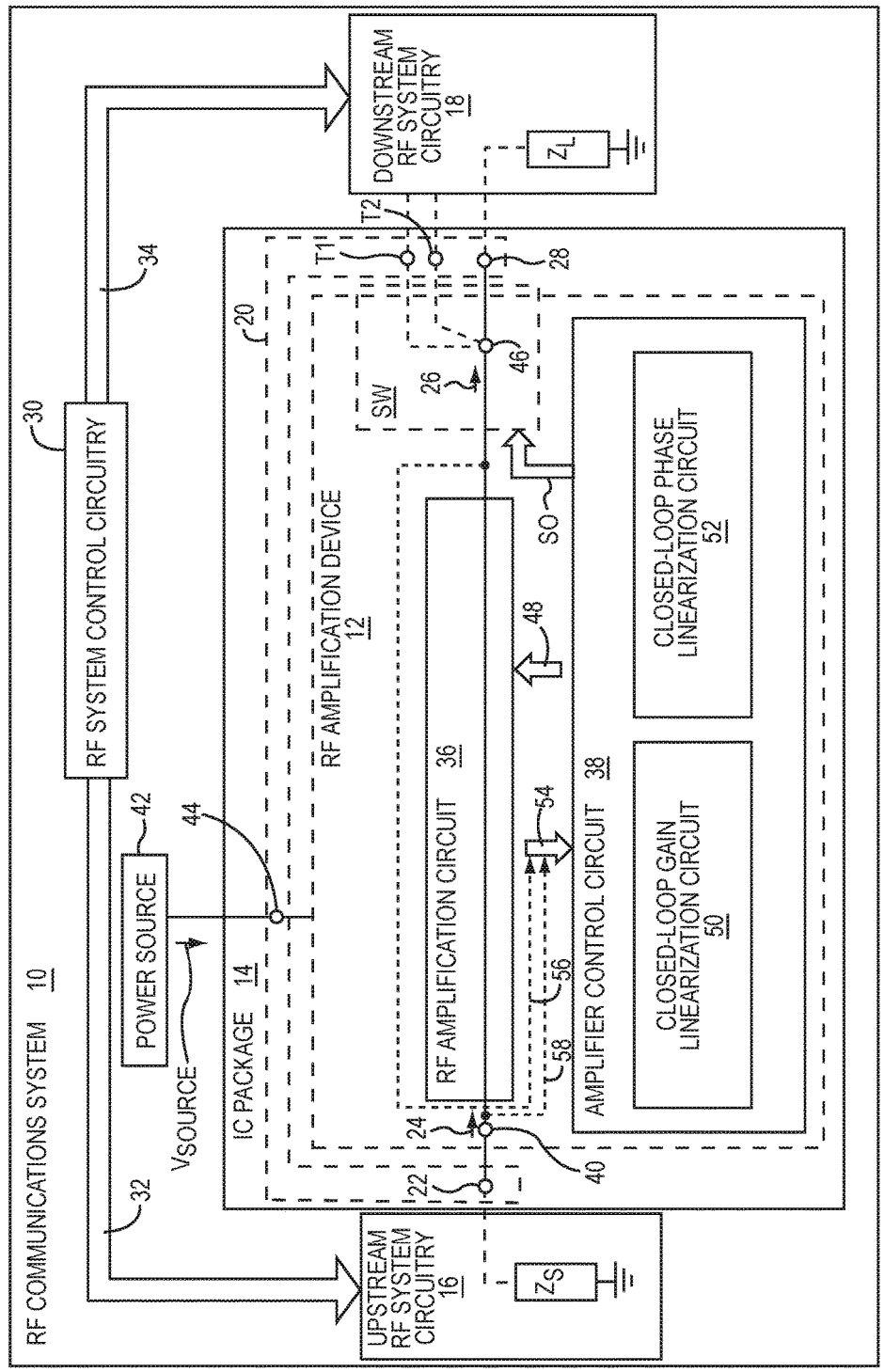
FIG. 1 illustrates a block diagram of an exemplary radio frequency (RF) communications system that includes an exemplary RF amplification device integrated into an exemplary integrated circuit (IC) package.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

With regard to the term "terminus," terminus refers to any conductive feature in an electronic component for receiving signals, transmitting signals, and/or establishing a connection to another electronic component. For instance, a terminus may be one or more nodes, ports, conductive pads, pins, solder bumps, terminals, leads, pins, and/or the like. To provide an example with regard to receiving and/or transmitting a single-ended signal, a terminus may be provided as a single terminal utilized to receive and/or transmit the single-ended signal. However, to be clear, this disclosure is not in any way limited to single-ended signals. Thus, to provide an example with regard to differential signals, a terminus may be provided as a pair of terminals for receiving and/or transmitting a positive and negative side of the differential signal.

With regard to the term "endogenous," endogenous refers to a signal, parameter, or action being derived and/or originating internally within an electronic component. For example, a set point for a closed-loop circuit is established endogenously by the closed-loop circuit, if the set point is derived and/or originates internally within the closed-loop circuit. In contrast, with regard to the term "exogenous," exogenous refers to a signal, parameter, or action being derived and/or originating externally from the electronic component. For example, the set point for a closed-loop circuit is established endogenously with respect to the closed-loop circuit, if the set point is derived and/or originates in external control circuitry outside of the closed-loop circuit.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

This disclosure relates to (radio frequency) RF communication systems for transmitting and/or receiving RF signals. In particular, this disclosure relates to RF amplification devices and methods for amplifying RF signals. As such, embodiments of exemplary RF amplification devices are described herein to comprehensively explain various innovative concepts and techniques related to the disclosure. In order to help describe these innovative concepts and techniques, the exemplary RF amplification devices disclosed herein include examples of exemplary circuits and circuit elements. To further elucidate these innovative concepts and techniques, the exemplary RF amplification devices are sometimes described as being employed within certain types of RF communication systems. It should be noted that the scope of this disclosure is not limited to the exemplary RF amplification device, circuits, circuit components, and RF communication systems specifically described herein. Rather, the scope of this disclosure extends to any and all systems, devices, circuits, circuit components and methods (whether described explicitly or implicitly) in accord with the innovative concepts and techniques described in this disclosure.

The innovative concepts and techniques described in this disclosure described herein can be used to amplify an RF signal with high power efficiency and/or by introducing low distortion. While not required, the exemplary RF amplification devices may thus be used to amplify RF signals provided within various RF communication bands and/or formatted in accordance with various RF communication standards in order to allow for wide-band amplification operations. However, the exemplary RF amplification devices described may implement to operate with increased autonomy and thus provide wide-band amplification operations with less or no support from other components within the RF communication system. The exemplary RF amplification devices can thus be easily provided within the RF communication system without requiring major customization and/or coordination with other system devices.

FIG. 1 illustrates a block diagram of one embodiment of an RF communications system 10. The RF communications system 10 may be any type of communication system capable of transmitting and/or receiving wireless communications signals. For example, the RF communications system 10 may be provided as an RF front-end module in a portable computing device (i.e., cellular phone, tablet, laptop) configured to transmit and/or receive information on one or more wireless communication networks. The RF communications system 10 may include one or more antennas and various transceiver chains (i.e., receiver chains and/or transmit chains) that process RF signals within different communication bands, formatted in accordance with different RF communication standards, and/or in accordance with different RF communication specifications for these RF communication standards.

In FIG. 1, the RF communications system 10 includes an exemplary RF amplification device 12 provided in an integrated circuit (IC) package 14. The RF amplification device 12 is coupled between upstream RF system circuitry 16 and downstream RF system circuitry 18 within the RF communications system 10. For example, the upstream RF system circuitry 16, the RF amplification device 12, and downstream RF system circuitry 18 may be or may be part of either one or more transmit chains or one or more receive chains within the RF communications system 10. The IC package 14 houses the RF amplification device 12 and allows the RF amplification device 12 to transmit and receive signals within the RF communications system 10 and external to the IC package 14. More specifically, the IC package 14 includes a package interface 20 configured to connect the RF amplification device 12 to external circuitry within the RF communications system 10. It should be noted that embodiments of the RF amplification device 12 may be provided as discrete component implementations.

As shown in FIG. 1, the package interface 20 includes a first package terminus 22 coupled to the upstream RF system circuitry 16. For example, the RF communications system 10 may be an RF transceiver and the upstream RF system circuitry 16, the RF amplification device 12, and downstream RF system circuitry 18 may be provided so as to form one or more transmit chains of the RF transceiver. As such, the RF communications system 10 may be provided in a user communication device, such as a laptop, a cellular phone, a tablet, a personal computer, or the like. In a transmit chain or in transmit chains, the upstream RF system circuitry 16 may include baseband circuitry and up-conversion circuitry that generates an RF signal 24. As such, the RF signal 24 is exogenous to the IC package 14 and thus the package interface 20 is coupled to the upstream RF system circuitry 16 in order to receive the RF signal 24 when the RF signal 24 is transmitted from the upstream RF system circuitry 16. More specifically, the IC package 14 receives the RF signal 24 at the first package terminus 22. The upstream RF system circuitry 16 thus provides a source of the RF amplification device 12 and presents a source impedance $Z_S$ at the first package terminus 22.

In the transmit chain(s), the RF amplification device 12 is configured to provide amplification prior to transmission by the RF communications system 10 from an antenna. As such, the RF amplification device 12 is configured to provide amplification to the RF signal 24 and generate an amplified RF signal 26. The amplified RF signal 26 is transmitted externally from a second package terminus 28 in the package interface 20 of the IC package 14 to the downstream RF system circuitry 18. A load of the RF amplification device 12 is thus provided by the downstream RF system circuitry 18, which presents a load impedance $Z_L$ at the second package terminus 28. Since this example presumes that the downstream RF system circuitry 18 is part of one or more transmit chains, the downstream RF system circuitry 18 includes the antenna of the RF communications system 10 along with an optional impedance tuner or antenna tuner. The downstream RF system circuitry 18 thus transmits the amplified RF signal 26 to the antenna, which emits the amplified RF signal 26.

The RF amplification device 12 shown in FIG. 1 is operable to operate autonomously and thus can be implemented in the RF communications system 10 without significant customization of the other components in the RF communications system 10. For example, the RF communications system 10 includes RF system control circuitry 30 which are external to the RF amplification device 12 and the IC package 14. The RF system control circuitry 30 is configured to provide control operations to coordinate the operations of the RF communications system 10. For example, the RF system control circuitry 30 may be configured to generate system control outputs 32, 34. A system control output 32 is received by the upstream RF system circuitry 16 in order to regulate its performance. Similarly, a system control output 34 is received by the downstream RF system circuitry 18 in order to regulate its performance. For example, the system control output 34 may tune the antenna tuner within the downstream RF system circuitry 18 and vary the load impedance $Z_L$. However, in this embodiment, the IC package 14, and thus the RF amplification device 12, does not receive a control output from the RF system control circuitry 30. Thus, the RF amplification device 12 can be implemented in the RF communications system 10 with little or no customization of the RF system control circuitry 30.

Alternatively, other embodiments of the IC package 14 and the RF amplification device 12 may receive control outputs from the RF system control circuitry 30 depending on the particular application being implemented. Nevertheless, the features of the RF amplification device 12 shown in FIG. 1 allow for the RF amplification device 12 to operate with more autonomy. Furthermore, the RF amplification device 12 may be designed to have wide-band amplification capabilities. Thus, the RF amplification device 12 is operable to amplify the RF signal 24 while allowing the RF signal 24 to be provided within different RF communication bands, to be formatted in accordance with different RF communication standards, and/or to be provided in accordance with different RF communication specifications within those RF communication standards. Exemplary RF communication standards and specifications include 2G Global System for Mobile Communications (GSM) standard (i.e., a Digital Communication System (DCS) specification, a Personal Communications Service (PCS) specification), GSM specifications, Enhanced Data Rates for GSM Evolution (EDGE) specifications of the 3G standard, Wireless Fidelity (Wi-Fi) Local Area Network (LAN) standards, and/or different specifications of the Long Term Evolution (LTE) standard. Furthermore, the RF signal 24 may be multiplexed in accordance with Time Division Duplex (TDD) techniques, Frequency Division Duplex (FDD) techniques, Space Division Multiplexing (SDM), Code Division Multiple Access Multiplexing (CDMA), Orthogonal Frequency Division Multiple Access Multiplexing (OFDMA), LTE diversity techniques, Multiple-Input and Multiple-Output (MIMO) techniques, and/or the like. The RF amplification device 12 is included in an RF signal path for the RF signal 24. The RF communications system 10 may or may not define additional RF signal paths for different communication bands, specifications, and/or communication standards.

The RF amplification device 12 shown in FIG. 1 includes an RF amplification circuit 36 and an amplifier control circuit 38. Thus, the RF amplification circuit 36 and the amplifier control circuit 38 are provided within the IC package 14. The RF amplification circuit 36 is configured to receive the RF signal 24 from the first package terminus 22 at an input terminus 40. A source voltage $V_{SOURCE}$ is generated by a power source 42 and provided to the RF amplification device 12 at a third package terminus 44 in the package interface 20. The source voltage $V_{SOURCE}$ powers the RF amplification circuit 36 and the amplifier control circuit 38 in the RF amplification device 12.

The RF amplification circuit 36 is configured to amplify the RF signal 24 so as to generate the amplified RF signal 26. In other words, the RF amplification circuit 36 provides amplification to the RF signal 24 by transferring power from the source voltage $V_{SOURCE}$ to the RF signal 24 thereby generating the amplified RF signal 26. The RF amplification circuit 36 then outputs the amplified RF signal 26 after amplification from an output terminus 46 coupled to the second package terminus 28. In this manner, the amplified RF signal 26 is transmitted externally to the downstream RF system circuitry 18.

The RF amplification circuit 36 may be configured to amplify the RF signal 24 when the RF signal 24 is provided in any one of plurality of communication bands and/or is formatted in accordance with any one of a multitude of RF communication standards. Often, the RF amplification circuit 36 is divided into RF amplification stages, including one or more driver RF amplification stages and a final RF amplification stage. Alternatively, the RF amplification circuit 36 may be provided having a single amplification stage. Other circuitry may be provided in the RF amplification circuit 36 in order to provide matching and/or to provide filtering so that undesired signal components (e.g., noise, harmonics) are reduced. The RF amplification circuit 36 is configured to amplify the RF signal 24 so as to generate the amplified RF signal 26 in accordance to a transfer function of the RF amplification circuit 36. Since the transfer function of the RF amplification circuit 36 is defined from input to output, the transfer function of the RF amplification circuit 36 shown in FIG. 1 is from the input terminus 40 to the output terminus 46.

Accordingly, as shown in FIG. 1, since the RF signal 24 may be provided within different RF communication bands, may be formatted in accordance with different RF communication standards, and/or may be provided in accordance with different RF communication specifications within those RF communication standards, the RF amplification device 12 may include an optional multiple-throw switch SW between the RF amplification circuit 36 and the downstream RF system circuitry 18. In this manner, the RF signal 24 may be exogenously transmitted to different antenna/impedance tuners (not shown) and antennas (not shown) in the downstream RF system circuitry 18, which may each be designed for particular or a particular combination RF communication bands, RF communication standards, and/or RF communication specifications. In this case, the output terminus 46 may be a pole port provided in the multiple-throw switch SW. The second package terminus 28 in the package interface 20 may be a throw port of the multiple-throw switch SW. However, the multiple-throw switch SW include any number of additional throw ports, such as the additional package termini T1, T2 in the package interface 20. The multiple-throw switch SW may be configured to selectively connect the output terminus 46 to any of the package termini T1, T2, 28. In this manner, the multiple-throw switch SW can be used to route the amplified RF signal 26 to the appropriate antenna tuner and the appropriate antenna in the downstream RF system circuitry 18. In one embodiment, the amplifier control circuit 38 is configured to generate a switching output SO to control the multiple-throw switch SW. The multiple-throw switch SW is responsive to the switching output SO so as to selectively connect the output terminus 46 to one of the package termini T1, T2, 28.

With regard to the amplifier control circuit 38, the amplifier control circuit 38 is operably associated with the RF amplification circuit 36 and is configured to control the transfer function of the RF amplification circuit 36. To do this, the amplifier control circuit 38 is configured to generate a control output 48, which may include one or more control signals that may be utilized to control the transfer function of the RF amplification circuit 36. For example, the amplifier control circuit 38 may include biasing circuitry that generates one or more bias signals, RF power converters (i.e., Low-Drop Out Regulators, RF switching converters, charge pumps, the like, or any combination thereof) that generate one or more supply voltages from the source voltage $V_{SOURCE}$ to power the RF amplification circuit 36, phase shifting components, and/or control blocks that generate control signals to adjust characteristic values in the RF amplification circuit 36. As such, the control output 48 generated by the amplifier control circuit 38 may include one or more bias signals, one or more supply voltages, and/or one or more control signals from the control blocks.

As shown in FIG. 1, the amplifier control circuit 38 also includes a closed-loop gain linearization circuit 50 and a closed-loop phase linearization circuit 52. In alternative embodiments, the amplifier control circuit 38 may have or operate only one of the two closed-loop linearization circuits 50, 52. It may also include open-loop linearization circuits. Both the closed-loop gain linearization circuit 50 and the closed-loop phase linearization circuit 52 are configured to increase linearization of a response characteristic defined by the transfer function of the RF amplification circuit 36. More specifically, with regards to the closed-loop gain linearization circuit 50, the response characteristic is a gain defined by the transfer function of the RF amplification circuit 36. Accordingly, the closed-loop gain linearization circuit 50 is configured to increase linearity of the gain of the RF amplification circuit 36. With regards to the closed-loop phase linearization circuit 52, the response characteristic is a phase shift defined by the transfer function of the RF amplification circuit 36. Accordingly, the closed-loop phase linearization circuit 52 is configured to increase linearity of the phase shift of the RF amplification circuit 36. Thus, the closed-loop phase linearization circuit 52 is configured to keep the phase shift of the RF amplification circuit 36 approximately constant. The closed-loop gain linearization circuit 50 and the closed-loop phase linearization circuit 52 provide increase linearity of the gain and the phase shift, respectively, within a communication band of interest of the RF signal 24, which may be a processed modulation signal. In some embodiments, the closed-loop gain linearization circuit 50 and the closed-loop phase linearization circuit 52 substantially linearize the gain and the phase shift, respectively. However, in other embodiments, the closed-loop gain linearization circuit 50 and the closed-loop phase linearization circuit 52 may simply reduce non-linearity.

To regulate the transfer function of the RF amplification circuit 36, the closed-loop gain linearization circuit 50 and the closed-loop phase linearization circuit 52 are each configured to generate one or more control signals. These control signals may be part of the control output 48 provided by the amplifier control circuit 38 to the RF amplification circuit 36. Thus, the control signals generated by the closed-loop gain linearization circuit 50 and the closed-loop phase linearization circuit 52 may be used to directly regulate the transfer function of the RF amplification circuit 36. Additionally and/or alternatively, the control signals may be utilized as inputs to other circuitry within the amplifier control circuit 38. For example, the control signals may be used to regulate the biasing circuitry, the RF power converters, and/or may be utilized as inputs to the control blocks that generate control signals for adjusting the characteristic values in the RF amplification circuit 36. As such, the control signals generated by the closed-loop gain linearization circuit 50 and the closed-loop phase linearization circuit 52 may be used to indirectly regulate the transfer function of the RF amplification circuit 36.

The amplifier control circuit 38 is configured to receive a control input 54 from the RF amplification circuit 36. The control input 54 may include various control signals that indicate parameter values related to the performance of the RF amplification circuit 36. In this regard, the closed-loop gain linearization circuit 50 and the closed-loop phase linearization circuit 52 are closed loop because the control signals generated by the closed-loop gain linearization circuit 50 and the closed-loop phase linearization circuit 52 depend on an output (i.e., the amplified RF signal 26) of the RF amplification circuit 36 or an analog of the output. As such, the control input 54 includes at least one feedback signal 56 that depends on the amplified RF signal 26 or an analog of the amplified RF signal 26.

As mentioned above, the RF amplification device 12 can operate autonomously while still providing wide-band amplification operations. To do this, the closed-loop gain linearization circuit 50 and the closed-loop phase linearization circuit 52 each endogenously establish a set point of the amplified RF signal 26 using the RF signal 24. Accordingly, the RF amplification device 12 and the IC package 14 do not receive an external control signal from the RF communications system 10, such as a reference signal from the RF system control circuitry 30, in order to establish the set points of the closed-loop gain linearization circuit 50 and the closed-loop phase linearization circuit 52. Instead, the closed-loop gain linearization circuit 50 and the closed-loop phase linearization circuit 52 each are configured to establish their respective set points endogenously within the IC package 14. As such, the control input 54 includes at least one reference signal 58 that depends on the RF signal 24. The control input 54 may also include exogenous control signals (e.g., from other package termini) that are received by the closed-loop gain linearization circuit 50 and/or the closed-loop phase linearization circuit 52. For example, these exogenous control signals may indicate a communication band, an RF communication standard, an RF communication specification, and/or a signal frequency of the RF signal 24. These exogenous control signals may be used to change operational characteristics of the closed-loop gain linearization circuit 50 and/or the closed-loop phase linearization circuit 52, such as an operational bandwidth and/or harmonic filter frequencies of the closed-loop gain linearization circuit 50 and/or the closed-loop phase linearization circuit 52.

While the closed-loop gain linearization circuit 50 is activate, the transfer function of the RF amplification circuit 36 defines a closed-loop gain response, and while the closed-loop gain linearization circuit 50 is inactive, the transfer function of the RF amplification circuit 36 defines an open-loop gain response. The amplified RF signal 26 has a signal amplitude, which is related to a signal amplitude (i.e., signal envelope level) of the RF signal 24 by the gain of the RF amplification circuit 36. The set point endogenously established by the closed-loop gain linearization circuit 50 is a target reference amplitude of the signal amplitude of the amplified RF signal 26. The closed-loop gain linearization circuit 50 is configured to set the target reference amplitude according to a target gain magnitude of the gain of the RF amplification circuit 36. In other words, the target reference amplitude indicates what the signal amplitude of the amplified RF signal 26 should be in order to set a gain magnitude of the gain of the RF amplification circuit 36 to the target gain magnitude. As such, the set point of the closed-loop gain linearization circuit 50 is also the target gain magnitude.

Similarly, while the closed-loop phase linearization circuit 52 is activate, the transfer function of the RF amplification circuit 36 defines a closed-loop phase response and, while the closed-loop phase linearization circuit 52 is inactive, the transfer function of the RF amplification circuit 36 defines an open-loop phase response. The set point endogenously established by the closed-loop phase linearization circuit 52 is a target reference phase of the amplified RF signal 26. The amplified RF signal 26 has a signal phase, which is related to a signal phase of the RF signal 24 by a phase shift of the RF amplification circuit 36. The closed-loop gain linearization circuit 50 is configured to set the target reference phase based on the target phase magnitude of the phase shift provided by the RF amplification circuit 36. For example, if the target phase magnitude is approximately zero (0) degrees, then the target reference phase may be approximately equal to the signal phase of the RF signal 24. If the target phase magnitude is approximately one hundred eighty (180) degrees, then the target reference phase may be approximately equal to an inverse of the signal phase of the RF signal 24. By establishing the set points of the closed-loop gain linearization circuit 50 and the closed-loop phase linearization circuit 52 endogenously using the RF signal 24, the RF amplification device 12 can operate autonomously while increasing the linearity of the transfer function of the RF amplification circuit 36. In this manner, the RF amplification device 12 can provide high linearity amplification operations without requiring exogenous control signals from the RF communications system 10 that indicate the set points.

The embodiment of the amplifier control circuit 38 shown in FIG. 1 includes both the closed-loop gain linearization circuit 50 and the closed-loop phase linearization circuit 52. However, it should be noted that in alternative embodiments, the amplifier control circuit 38 may only include either the closed-loop gain linearization circuit 50 or the closed-loop phase linearization circuit 52. Whether both or either of the closed-loop gain linearization circuit 50 and the closed-loop phase linearization circuit 52 are provided may depend on the particular performance characteristics of the RF amplification circuit 36.

Figure 2:
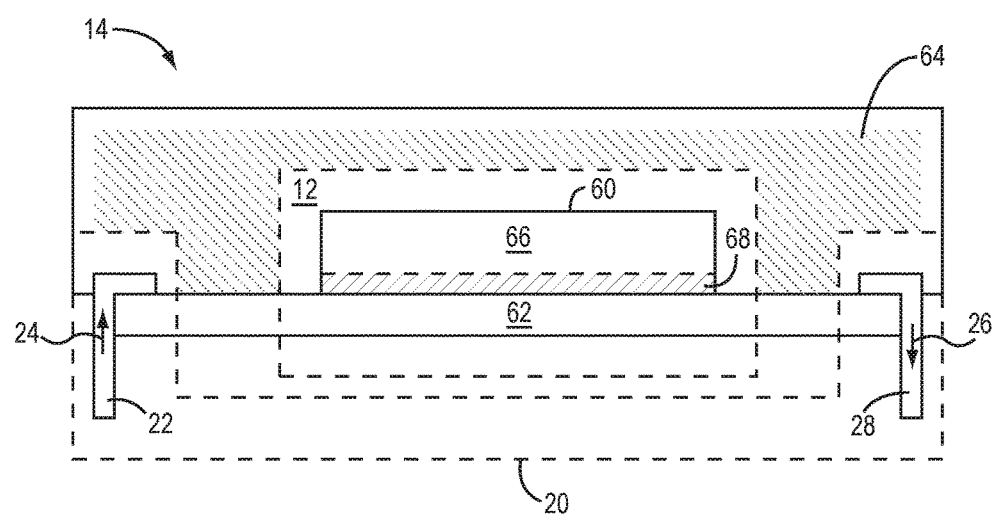
FIG. 2 is a cross-sectional view of an exemplary physical layout of the IC package shown in FIG. 1.

FIG. 2 is a cross-sectional view of an exemplary physical layout of the IC package 14 shown in FIG. 1. The RF amplification device 12 is integrated into the IC package 14 so that the IC package 14 houses the RF amplification device 12. The IC package 14 includes a semiconductor die 60, a package board 62, molding 64, and an exemplary embodiment of the package interface 20 described above in FIG. 1. An IC is formed by the semiconductor die 60. The RF amplification device 12 may be formed partially or entirely by the semiconductor die 60 depending on the application and topology of the RF amplification device 12. In alternative embodiments, the IC package 14 may include multiple semiconductor dice (like the semiconductor die 60) and the RF amplification device 12 may be built on the multiple semiconductor dies. For example, the RF amplification circuit 36 (shown in FIG. 1) and the amplifier control circuit 38 (shown in FIG. 1) may be formed on separate semiconductor dice. Additionally, one or more of the RF amplifier stages 36A, 36B, 36C (shown in FIG. 1) may be built on separate semiconductor dice. Furthermore, the closed-loop gain linearization circuit 50 and the closed-loop phase linearization circuit 52 may be built on separate semiconductor dice. Other types of substrates may be mounted in the IC package 14, such as glass substrates, plastic substrates, or any type of substrate made from a suitable substrate material. Portions of the RF amplification device 12 may be formed on these other types of substrates. These and other combinations would be apparent to one of ordinary skill in the art in light of this disclosure.

With regard to the semiconductor die 60 shown in FIG. 1, the semiconductor die 60 includes a semiconductor substrate 66 used to form active semiconductor components of the IC. The semiconductor substrate 66 may be formed from doped and non-doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (In-GaAs), and/or the like. Furthermore, metallic layers may be formed on a top, within, and/or a bottom of the semiconductor substrate 66 to provide termini of the active semiconductor components, to form passive impedance elements, and/or the like. Insulating layers, such as oxide layers, and metal layers may also be provided in or on the semiconductor substrate 66. For example, the passive impedance elements may also be formed in or on the semiconductor substrate 66 from the metallic layers.

The semiconductor die 60 also includes a Back-End-of-Line (BEOL) 68, which may be formed from a non-conductive substrate and a plurality of metallic layers provided on or in the insulating substrate. The BEOL 68 is configured to couple the components on the semiconductor substrate 66 to one another. Termini may also be provided by the BEOL 68 to provide connections by external components to the IC. The BEOL 68 may also be used to form passive impedance elements.

A topology of the semiconductor die 60 formed by the semiconductor substrate 66 and the BEOL 68 that form the IC may be in accordance to any suitable semiconductor technology, such as Complementary Metal-On-Oxide Semiconductor technology (CMOS), Bipolar-Complementary Metal-On-Oxide Semiconductor technology (BiCMOS), Silicon-On-Insulator technology (SOI), and/or the like. In this embodiment, the topology of the semiconductor die 60 is provided in accordance with CMOS technology since it is inexpensive, allows the IC to be small, and allows for easy manufacturing. The closed-loop gain linearization circuit 50 (shown in FIG. 1) and the closed-loop phase linearization circuit 52 (shown in FIG. 1) allow for the topology of the semiconductor die 60 to be provided in accordance with CMOS technology while still providing high linearity amplification operations.

The semiconductor die 60 is mounted on the package board 62 within the IC package 14. The package board 62 may be formed by a plurality of board layers formed from a non-conductive material and metallic layers. The non-conductive material that forms the board layers may be a dielectric, a laminate, fibers, glass, ceramic, and/or the like. The dielectric may be a Silicon Oxide (SiO$_x$), Silicon Nitride (SiN$_x$), and/or the like. The laminate may be FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like. The metallic layers of the package board may be used to form termini, passive impedance components, and connections. For instance, the metallic layers are used form connections between the semiconductor die 60 and the package interface 20. Also, although the RF amplification device 12 may be provided entirely by the IC formed by the semiconductor die 60, components of the RF amplification device 12 may also be formed using the metallic layers in the package board 62. The semiconductor die 60 shown in FIG. 2 is encapsulated by the molding 64, which may be formed from a non-conductive material to help insulate the semiconductor die 60 and the RF amplification device 12. In this manner, the semiconductor die 60 is protected from external electromagnetic noise generated outside the IC package 14.

FIG. 2 also illustrates an example of the package interface 20. In this embodiment, the package interface 20 is coupled to the package board 62 so that signals can be transmitted to and received from circuitry external to the IC package 14. An embodiment of the first package terminus 22 for receiving the RF signal 24 and an embodiment of the second package terminus 28 for transmitting the amplified RF signal 26 are shown in FIG. 2. In this embodiment, the first package terminus 22 and the second package terminus 28 are each provided as pins connected to the package board 62. An embodiment of the third package terminus 44 (shown in FIG. 1 but not FIG. 2) is also provided as a pin connected to the package board 62. As mentioned above, the RF amplification device 12 may be configured to operate autonomously and thus the IC package 14 may have a small number of pins. For example, the IC package 14 may be less than eleven (11) pins. In this embodiment, the IC package 14 has a total of eight (8) pins.

Figure 3:
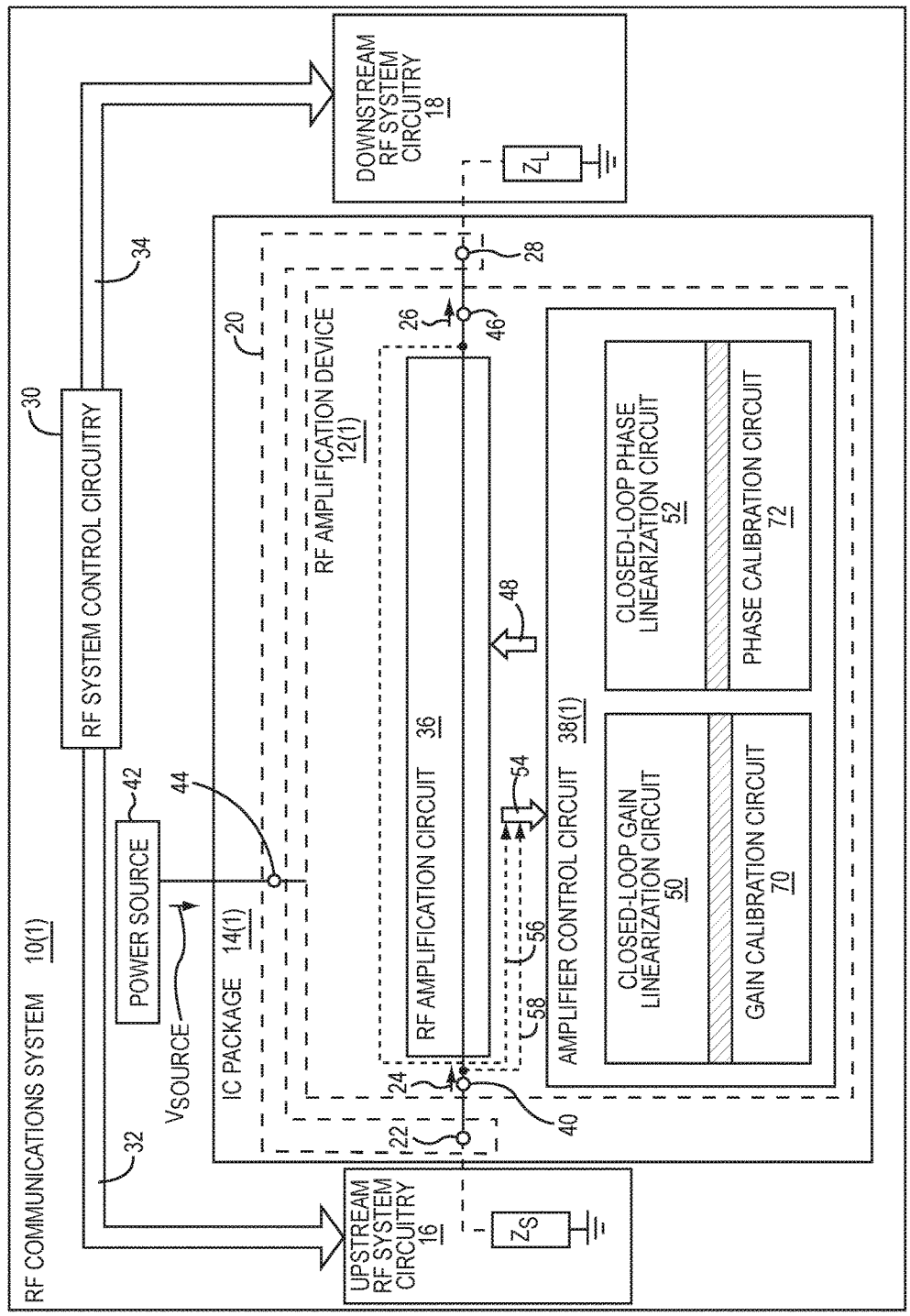
FIG. 3 is a block diagram of another exemplary RF communications system, RF amplification device, and IC package, which are embodiments of the RF communications system, the RF amplification device, and the IC package shown in FIG. 1.

Referring now to FIG. 3, FIG. 3 is a block diagram of another exemplary RF communications system 10(1), RF amplification device 12(1), and an IC package 14(1) that houses the RF amplification device, which are embodiments of the RF communications system 10, the RF amplification device 12, and the IC package 14 described above in FIG. 1. The RF amplification device 12 also includes the RF amplification circuit 36 described above with respect to FIG. 1 along with an amplifier control circuit 38(1). The amplifier control circuit 38(1) is one embodiment of the amplifier control circuit 38 described above with respect to FIG. 1. However, in this embodiment, the amplifier control circuit 38(1) further includes a gain calibration circuit 70 and a phase calibration circuit 72. Alternative embodiments of the amplifier control circuit 38(1) may include only the gain calibration circuit 70 or the phase calibration circuit 72.

Slanted lines are included between the gain calibration circuit 70 and the closed-loop gain linearization circuit 50 in order to indicate that the gain calibration circuit 70 and the closed-loop gain linearization circuit 50 may be partially integrated with one another (and thus share components) or may be independent (and thus not share components). As explained in further below, at small-signal power levels, the closed-loop gain linearization circuit 50 may be deactivated and thus the RF amplification circuit 36 may amplify the RF signal 24 in accordance with the open-loop gain response defined by the transfer function of the RF amplification circuit 36. At these small-signal power levels when the closed-loop gain linearization circuit 50 is inactive, the open-loop gain response may be substantially linear. As discussed above, while the closed-loop gain linearization circuit 50 is activate, the closed-loop gain response defined by the transfer function is also linear. However, without the gain calibration circuit 70, the gain of the RF amplification circuit 36 may be different during the closed-loop gain response and the open-loop gain response. The gain calibration circuit 70 is configured to reduce a difference between the closed-loop gain response and the open-loop gain response. For example, the gain calibration circuit 70 may be configured to substantially eliminate the difference between the closed-loop gain response and the open-loop gain response. Accordingly, the gain of the RF amplification circuit 36 may be substantially the same during the closed-loop gain response and the open-loop gain response.

With regard to the phase-calibration circuitry, slanted lines are included between the phase calibration circuit 72 and the closed-loop phase linearization circuit 52 in order to indicate that the phase calibration circuit 72 and the closed-loop phase linearization circuit 52 may be partially integrated with one another and thus share components) or may be independent (and thus not share components). As explained further below, at small-signal power levels, the closed-loop phase linearization circuit 52 may be inactive and thus the RF amplification circuit 36 may amplify the RF signal 24 in accordance with the open-loop phase response defined by the transfer function of the RF amplification circuit 36. At these small-signal power levels when the closed-loop phase linearization circuit 52 is inactive, the open-loop phase response may be substantially linear. As discussed above, while the closed-loop phase linearization circuit 52 is activate, the closed-loop phase response defined by the transfer function is also linear. However, without the phase calibration circuit 72, the phase shift of the RF amplification circuit 36 may be different during the closed-loop phase response and the open-loop phase response. The phase calibration circuit 72 is configured to reduce a difference of the closed-loop phase response and the open-loop phase response. For example, the phase calibration circuit 72 may be configured to substantially eliminate the difference between the closed-loop phase response and the open-loop phase response. Accordingly, the phase shift of the RF amplification circuit 36 may be substantially the same during the closed-loop phase response and the open-loop phase response.

Figure 4:
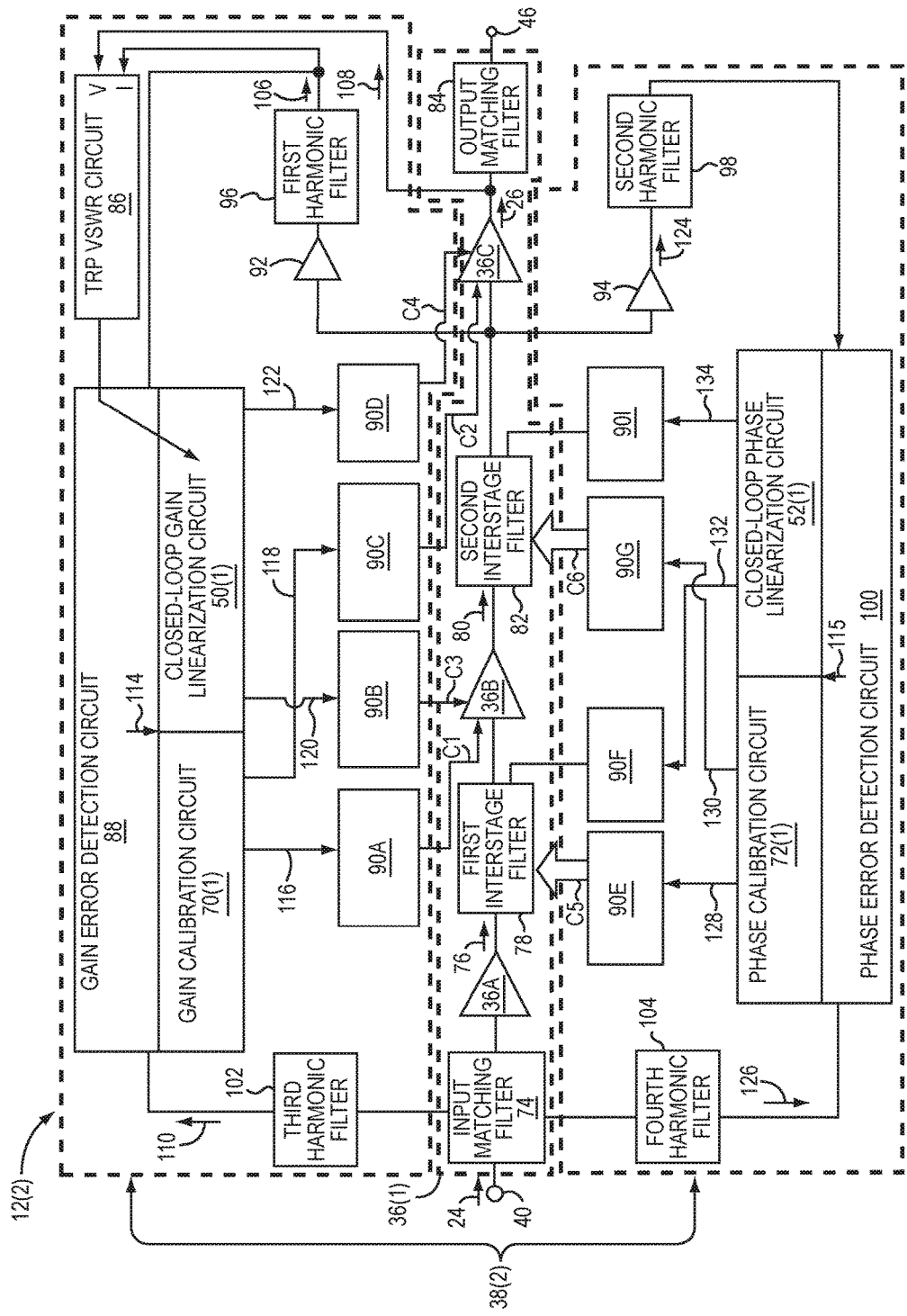
FIG. 4 is a block diagram of another embodiment of an RF amplification device, which is a more detailed example of the RF amplification device shown in FIG. 3.

FIG. 4 illustrates a block diagram of another embodiment of an RF amplification device 12(2), which is a more detailed example of the RF amplification device 12(1) shown in FIG. 3. The RF amplification device 12(2) includes one embodiment of an RF amplification circuit 36(1) and an embodiment of an amplifier control circuit 38(2). The RF amplification circuit 36(1) is one embodiment of the RF amplification circuit 36 described above in FIG. 1. However, in this embodiment, the RF amplification circuit 36(1) includes a plurality of RF amplifier stages 36A, 36B, 36C coupled in cascade. Accordingly, each of the plurality of RF amplifier stages 36A, 36B, 36C is operable to provide amplification and by being coupled in cascade, the RF amplifier stages 36A, 36B, 36C provide amplification to the RF signal 24 in sequence.

The RF amplification circuit 36(1) shown in FIG. 1 has an initial RF amplifier stage 36A, an intermediate RF amplifier stage 36B, and a final RF amplifier stage 36C. However, other embodiments of the RF amplification circuit 36(1) may include any number of RF amplifier stages as described above. Often, the initial RF amplifier stage 36A and the intermediate RF amplifier stage 36B are classified as "driver" RF amplifier stages. Since the final RF amplifier stage 36C handles the most power, some embodiments of the final RF amplifier stage 36C may include arrays of transistors or stacks of transistors in order to handle the power levels seen by the final RF amplifier stage 36C.

In this embodiment, an input matching filter 74 is configured to initially receive the RF signal 24 from the input terminus 40. The input matching filter 74 is configured to substantially match an input impedance of the RF amplification circuit 36(1) to the source impedance $Z_S$ (shown in FIG. 1) of the upstream RF system circuitry 16 (shown in FIG. 1). Since the RF amplifier stages 36A, 36B, 36C are coupled in cascade, the RF amplifier stages 36A, 36B, 36C provide amplification to the RF signal 24 in a sequence. Accordingly, the initial RF amplifier stage 36A receives the RF signal 24 from the input matching filter 74. The initial RF amplifier stage 36A is configured to amplify the RF signal 24 so as to generate a first interstage RF signal 76 in accordance with an amplifier gain $G_{initial}$. A first interstage filter 78 is coupled between the initial RF amplifier stage 36A and the intermediate RF amplifier stage 36B. The first interstage filter 78 is configured to filter undesired signal components (e.g., noise and/or harmonics) from the first interstage RF signal 76 after amplification by the initial RF amplifier stage 36A. Once the RF signal 24 is amplified by the initial RF amplifier stage 36A and the first interstage RF signal 76 has been filtered by the first interstage filter 78, the intermediate RF amplifier stage 36B receives the first interstage RF signal 76.

The intermediate RF amplifier stage 36B is configured to amplify the first interstage RF signal 76 so as to generate a second interstage RF signal 80 in accordance with an amplifier gain $G_{intermediate}$. A second interstage filter 82 is coupled between the intermediate RF amplifier stage 36B and the final RF amplifier stage 36C. The second interstage filter 82 is configured to filter undesired harmonics from the second interstage RF signal 80 after amplification by the intermediate RF amplifier stage 36B. Once the first interstage RF signal 76 is amplified by the intermediate RF amplifier stage 36B and the second interstage RF signal 80 has been filtered by the second interstage filter 82, the final RF amplifier stage 36C receives the second interstage filter 82. The final RF amplifier stage 36C is configured to amplify the RF signal 24 so as to generate the amplified RF signal 26 in accordance to an amplifier gain $G_{final}$. As such, the gain of the RF amplification circuit 36(1) may be described as $G_{initial}*G_{intermediate}*G_{final}$. An output matching filter 84 is coupled to the final RF amplifier stage 36C so as to receive the amplified RF signal 26. The output matching filter 84 is configured to substantially match an output impedance of the RF amplification circuit 36(1) to the load impedance $Z_L$ (shown in FIG. 1) of the downstream RF system circuitry 18 (shown in FIG. 1).

The amplifier gain $G_{initial}$, the amplifier gain $G_{intermediate}$, and the amplifier gain $G_{final}$ may each be any type of amplifier gain (e.g., a voltage gain, a transconductance gain, a transresistance gain, a current gain) depending on the topology of each of the corresponding RF amplifier stages 36A, 36B, 36C. For example, the amplifier gain $G_{initial}$, the amplifier gain $G_{intermediate}$, and the amplifier gain $G_{final}$ may each be the same type of amplifier gain or each may be a different types of amplifier gain. As such, the gain of the RF amplification circuit 36(1) may be any type of amplifier gain depending on a combination of the types amplifier gain $G_{initial}$, the amplifier gain $G_{intermediate}$, and the amplifier gain $G_{final}$ provided by each of the RF amplifier stages 36A, 36B, 36C.

Note that as amplification progresses through the sequence of the RF amplifier stages 36A, 36B, 36C, each of the RF amplifier stages 36A, 36B, 36C, handles an increasing amount of power. Therefore, the initial RF amplifier stage 36A handles the least amount of power, since it receives the RF signal 24 prior to amplification and transmits the first interstage RF signal 76 amplified only in accordance with the amplifier gain $G_{initial}$. In one embodiment, the amplifier gain $G_{initial}$ is a voltage gain. Thus, the initial RF amplifier stage 36A amplifies the RF signal 24 such that the amplifier gain $G_{initial}$ approximately describes a proportion between a voltage level of the first interstage RF signal 76 and a voltage level of the RF signal 24.

When the intermediate RF amplifier stage 36B receives the first interstage RF signal 76, the first interstage RF signal 76 has already been amplified by the amplifier gain $G_{initial}$. The intermediate RF amplifier stage 36B further amplifies the first interstage RF signal 76 and generates the second interstage RF signal 80. Thus, the intermediate RF amplifier stage 36B transmits the second interstage RF signal 80 amplified in accordance with the amplifier gain $G_{initial}$ $G_{intermediate}$. As a result, the intermediate RF amplifier stage 36B handles an intermediate amount of power. In one embodiment, the amplifier gain $G_{intermediate}$ is a transconductance gain. Thus, the intermediate RF amplifier stage 36B amplifies the first interstage RF signal 76 such that the amplifier gain $G_{intermediate}$ approximately describes a proportion between a current level of the second interstage RF signal 80 and the voltage level of the first interstage RF signal 76.

With regard to the final RF amplifier stage 36C, the final RF amplifier stage 36C receives the second interstage RF signal 80 amplified in accordance with the aggregate amplifier gain $G_{initial}$ $G_{intermediate}$. As such, when the final RF amplifier stage 36C further amplifies the second interstage RF signal 80 so as to generate the amplified RF signal 26. In one embodiment, the amplifier gain $G_{final}$ is a current gain. Thus, the final RF amplifier stage 36C amplifies the second interstage RF signal 80 such that the amplifier gain $G_{final}$ approximately describes a proportion between a current level of the amplified RF signal 26 and the current level of the second interstage RF signal 80. The final RF amplifier stage 36C thus transmits the amplified RF signal 26 amplified in accordance with the (total) gain ($G_{initial}$ $G_{intermediate}$ $G_{final}$) of the RF amplification circuit 36(1). As such, the final RF amplifier stage 36C handles the most power. Furthermore the (total) gain of the RF amplification circuit 36(1) is a transconductance gain.

Alternatively, the amplifier gain $G_{final}$ of the final RF amplifier stage 36C may be a transconductance gain. In this of embodiment, the output matching filter 84 may be configured to present an input impedance that converts a current level of the amplified RF signal 26 provided by the final RF amplifier stage 36C into a voltage level. Additionally, in another alternative embodiment, the amplifier gain $G_{intermediate}$ of the intermediate RF amplifier stage 36B is a transconductance gain, and a load impedance of the second interstage filter 82 converts a current level of the second interstage RF signal 80 into a voltage level.

FIG. 4 also illustrates the amplifier control circuit 38(2) used to regulate the RF amplification circuit 36(1). The amplifier control circuit 38(2) includes a closed-loop gain linearization circuit 50(1), a phase calibration circuit 72(1), a gain calibration circuit 70(1), and a phase calibration circuit 72(1), which are embodiments of the closed-loop gain linearization circuit 50, the phase calibration circuit 72, the gain calibration circuit 70, and the phase calibration circuit 72 described above with respect to FIGS. 1 and 3. The amplifier control circuit 38(2) further includes a Total Radiated Power (TRP) Voltage Standing Wave Ratio (VSWR) circuit 86, a gain error detection circuit 88, a driver stage gain control block 90A, a driver stage gain control block 90B, a final stage gain control block 90C, a final stage gain control block 90D, a driver stage phase control block 90E, a driver stage phase control block 90F, a final stage phase control block 90G, a final stage phase control block 90I, a first final stage replica amplifier 92, a second final stage replica amplifier 94, a first harmonic filter 96, a second harmonic filter 98, a phase error detection circuit 100, a third harmonic filter 102, and a fourth harmonic filter 104.

The TRP VSWR circuit 86 is a closed-loop feedback control circuit configured to make a VSWR measurement and adjust a feedback gain of the closed-loop gain linearization circuit 50 in accordance with the VSWR measurement. For example, the TRP VSWR circuit 86 may be configured to adjust the feedback gain of the closed-loop gain linearization circuit 50 in accordance with the VSWR measurement so as to maintain an output power level of the amplified RF signal 26 substantially constant over a range of the load impedance $Z_L$ (shown in FIG. 1). The TRP VSWR circuit 86 may be configured to adjust the feedback gain of the closed-loop gain linearization circuit 50 in accordance with the VSWR measurement so as to maintain the closed-loop gain linearization circuit 50 out of unstable control regions. In order to make the VSWR measurement, the TRP VSWR circuit 86 is configured to receive a first feedback signal 106 and a second feedback signal 108. The first feedback signal 106 has a first feedback signal level that is indicative of a current level of the amplified RF signal 26. The second feedback signal 108 has a second feedback signal level that is indicative of a voltage level of the amplified RF signal 26. As such, the TRP VSWR circuit 86 is configured to make the VSWR measurement using the first feedback signal 106 and the second feedback signal 108. In combination, the first feedback signal level of the first feedback signal 106 and the second feedback signal level of the second feedback signal 108 are indicative of TRP of the amplified RF signal 26.

In this embodiment, the closed-loop gain linearization circuit 50 and the gain calibration circuit 70 are partially amalgamated since the closed-loop gain linearization circuit 50 and the gain calibration circuit 70 share the gain error detection circuit 88. Alternatively, the closed-loop gain linearization circuit 50 and the gain calibration circuit 70 may each have independent error detection circuits (like the gain error detection circuit 88) and may thus be independent of one another. In this embodiment, the gain error detection circuit 88 is configured to receive the first feedback signal 106 and a first reference signal 110 having a reference signal level that is indicative of a power level of the RF signal 24. Using the first reference signal 110, the gain error detection circuit 88 is configured to set the set point of the closed-loop gain linearization circuit, which is indicative of the target reference amplitude of the amplified RF signal 26. The set point therefore further indicates the target gain magnitude, and is established based on the reference signal level of the first reference signal 110. By having the TRP VSWR circuit 86 adjust the feedback gain based on the VSWR measurement and using the first feedback signal 106, the gain error detection circuit 88 is configured to provide feedback indicative of a signal power level of the amplified RF signal 26. The gain error detection circuit 88 is configured to compare the feedback and the set point to generate a gain error signal 114 having an error signal level indicative of a power level error between the feedback and the set point. For example, the reference signal level may indicate a current level of the amplified RF signal 26. Given an impedance value of the load impedance $Z_L$ (shown in FIG. 1), the current level indicates the signal power level. If the impedance value changes to a different impedance value, the TRP VSWR circuit 86 adjusts the feedback gain so that the current level of the amplified RF signal 26 continues to indicate the signal power level of the amplified RF signal 26. As such, the reference signal level also indicates the signal power level.

The gain error signal 114 is provided to the closed-loop gain linearization circuit 50(1) and the gain calibration circuit 70(1). With regard to the gain calibration circuit 70(1), the gain calibration circuit 70(1) is configured to use the gain error signal 114 to determine calibration points as explained in further detail below. In this embodiment, the gain calibration circuit 70(1) is operably associated with the driver stage gain control block 90A and the final stage gain control block 90C. As shown in the following description, two or more gain control blocks 90A, 90C can be provided to operate with more than one of the RF amplifier stages 36A, 36B, 36C. In this embodiment, the gain calibration circuit 70(1) is configured to generate a first gain calibration signal 116 which is received by the driver stage gain control block 90A and a second gain calibration signal 118 which is received by the final stage gain control block 90C. The driver stage gain control block 90A is configured to generate a control signal C1 that sets the gain of the intermediate RF amplifier stage 36B while the final stage gain control block 90C is configured to generate a control signal C2 that sets the gain of the final RF amplifier stage 36C. With the first gain calibration signal 116 and the second gain calibration signal 118, the gain calibration circuit 70(1) is configured to control the driver stage gain control block 90A and the final stage gain control block 90C and thereby control the gain of the RF amplification circuit 36(1). As explained in further detail below, the gain calibration circuit 70(1) controls the gain of the RF amplification circuit 36(1) in order to reduce the difference between the open-loop gain response and closed-loop gain response of the RF amplification circuit 36(1). In one exemplary embodiment, the driver stage gain control block 90A is an impedance control and the control signal C1 is an impedance control signal that sets an internal impedance level of the intermediate RF amplifier stage 36B. Additionally, the final stage gain control block 90C is a final stage biasing circuit and the control signal C2 is a bias signal that sets a quiescent operating level of the final RF amplifier stage 36C. In alternative embodiments, the gain control blocks 90A, 90C may be configured to control other operational characteristics such as biasing, impedance, and the like.

With regard to the closed-loop gain linearization circuit 50(1), the closed-loop gain linearization circuit 50(1) is configured to adjust the gain of the RF amplification circuit 36(1) in accordance to the gain error signal 114 while activated so as to maintain the gain of the RF amplification circuit 36(1) relatively constant. In this embodiment, the closed-loop gain linearization circuit 50(1) is operably associated with the driver stage gain control block 90B and the final stage gain control block 90D. The closed-loop gain linearization circuit 50(1) is configured to generate a first gain control signal 120 which is received by the driver stage gain control block 90B and a second gain control signal 122 which is received by the final stage gain control block 90D. The driver stage gain control block 90B is configured to generate a control signal C3 that sets the gain of the intermediate RF amplifier stage 36B while the final stage gain control block 90D 90CF is configured to generate a control signal C4 that sets the gain of the final RF amplifier stage 36C. With the first gain control signal 120 and the second gain control signal 122, the closed-loop gain linearization circuit 50(1) is configured to control the driver stage gain control block 90B and the final stage gain control block 90D and thereby control the gain of the RF amplification circuit 36(1). As explained in further detail below, the closed-loop gain linearization circuit 50(1) regulates the gain of the RF amplification circuit 36(1) in order to maintain the closed-loop gain response of the RF amplification circuit 36(1) substantially constant. In one exemplary embodiment, the driver stage gain control block 90B is an impedance control block with a low pass filter and the control signal C3 is an impedance control signal that sets an internal impedance level of the intermediate RF amplifier stage 36B. Additionally, the final stage gain control block 90D is a biasing circuit with a low pass filter and the control signal C4 is a bias signal that sets the quiescent operating level of the final RF amplifier stage 36C.

With regard to phase control, the closed-loop phase linearization circuit 52(1) and the phase calibration circuit 72(1) are partially amalgamated since the closed-loop phase linearization circuit 52(1) and the phase calibration circuit 72(1) share a phase error detection circuit 100. Alternatively, the closed-loop phase linearization circuit 52(1) and the phase calibration circuit 72(1) may each have independent error detection circuits (like the phase error detection circuit 100) and may thus be independent of one another. In this embodiment, the phase error detection circuit 100 is configured to receive a third feedback signal 124 having a third feedback signal level that indicates a phase of the amplified RF signal 26 and a second reference signal 126 having a second reference signal level that is indicative of a phase of the RF signal 24. Using the second reference signal 126, the phase error detection circuit 100 is configured to set the set point of the closed-loop phase linearization circuit 52(1), which is indicative of a target phase shift of the RF amplification circuit 36(1). The phase error detection circuit 100 is also configured to compare measure the phase shift of the RF amplification circuit 36(1) using the third feedback signal 124 and the second reference signal 126 as feedback. The phase error detection circuit 100 generates an phase error signal 115 having an error signal level indicative of a phase shift error between the feedback and the set point (reference).

The phase error signal 115 is provided to the closed-loop phase linearization circuit 52(1) and the phase calibration circuit 72(1). With regard to the phase calibration circuit 72(1), the phase calibration circuit 72(1) is configured to use the phase error signal 115 to determine calibration points as explained in further detail below. In this embodiment, the phase calibration circuit 72(1) is operably associated with the driver stage phase control block 90E and the final stage phase control block 90G. The phase calibration circuit 72(1) is configured to generate a first phase calibration signal 128 which is received by the driver stage phase control block 90E and a second phase calibration signal 130 which is received by the final stage phase control block 90G. The driver stage phase control block 90E is configured to generate a control output C5 that sets a phase shift of the intermediate RF amplifier stage 36B while the final stage phase control block 90G is configured to generate a control output C6 that sets a phase shift of the final RF amplifier stage 36C. With the first phase calibration signal 128 and the second phase calibration signal 130, the phase calibration circuit 72(1) is configured to control the driver stage phase control block 90E and the final stage phase control block 90G and thereby regulate the phase shift of the RF amplification circuit 36. As explained in further detail below, the phase calibration circuit 72(1) controls the phase shift of the RF amplification circuit 36 in order to reduce the difference between the open-loop phase response and closed-loop phase response of the RF amplification circuit 36. In one exemplary embodiment, the driver stage phase control block 90E is an impedance control circuit and the control output C5 is a control word that sets a capacitance of a capacitor bank in the first interstage filter 78. Additionally, the final stage phase control block 90G is an impedance control circuit and the control output C6 is a control word that sets a capacitance of a capacitor bank in the second interstage filter 82.

With regard to the closed-loop phase linearization circuit 52(1), the closed-loop phase linearization circuit 52(1) is configured to adjust the phase shift of the RF amplification circuit 36 in accordance to the phase error signal 115 while activated so as to maintain the phase shift of the RF amplification circuit 36 relatively constant. In this embodiment, the closed-loop phase linearization circuit 52(1) is operably associated with the driver stage phase control block 90F and the final stage phase control block 90I. The closed-loop phase linearization circuit 52(1) is configured to generate a first phase control signal 132 which is received by the driver stage phase control block 90F and a second phase control signal 134 which is received by the final stage phase control block 90I. The driver stage phase control block 90F is configured to set the phase shift of the first interstage filter 78 and/or the intermediate RF amplifier stage 36B using the first phase control signal 132, while the final stage phase control block 90I is configured to set the phase shift of the second interstage filter 82 and/or the final RF amplifier stage 36C using the second phase control signal 134. In this manner, the closed-loop phase linearization circuit 52(1) is configured to control the phase shift of the RF amplification circuit 36(1). In one exemplary embodiment, the driver stage phase control block 90F is a varactor and the first phase control signal 132 is used to set a variable capacitance of the varactor. Additionally, the final stage phase control block 90I may also be a varactor and the second phase control signal 134 is used to set a variable capacitance of the varactor.

To avoid the use of bulky couplers for power detection, a first final stage replica amplifier 92 is configured to generate the first feedback signal 106. As mentioned above, the first feedback signal level of the first feedback signal 106 is indicative of the current level of the amplified RF signal 26. However, in this embodiment, the first feedback signal 106 is not generated as direct feedback resulting from the amplified RF signal 26. Instead, the first final stage replica amplifier 92 is configured to generate the first feedback signal 106 as an analog of the amplified RF signal 26. The first final stage replica amplifier 92 is a scaled-down version of the final RF amplifier stage 36C and is coupled to receive the second interstage RF signal 80 just like the final RF amplifier stage 36C. The first final stage replica amplifier 92 is configured to generate the first feedback signal 106 such that the first feedback signal level is a scaled down replication of the current level of the amplified RF signal 26. Since the first feedback signal 106 is not filtered by the output matching filter 84, the first harmonic filter 96 is configured to filter high-frequency harmonics from the first feedback signal 106 and increase the performance of the gain error detection circuit 88. Furthermore, it should be noted that the TRP VSWR circuit 86 is coupled to receive the second feedback signal 108 before the amplified RF signal 26 is filtered by the output matching filter 84. This avoids a propagation delay of the output matching filter 84, which can be detrimental to the operations of the TRP VSWR circuit 86.

The second final stage replica amplifier 94 shown in FIG. 4 is configured to generate the third feedback signal 124. As mentioned above, the third feedback signal level of the third feedback signal 124 is indicative of the phase of the amplified RF signal 26. In this way, the static or slowly varying phase coming from the load impedance $Z_L$ (shown in FIG. 1) is rejected and only the dynamic phase variation is passed to the closed-loop phase linearization circuit 52(1). However, the third feedback signal 124 is not generated as direct feedback resulting from the amplified RF signal 26. Instead, the second final stage replica amplifier 94 is configured to generate the third feedback signal 124 as an analog of the amplified RF signal 26. The second final stage replica amplifier 94 is a scaled-down version of the final RF amplifier stage 36C and is coupled to receive the second interstage RF signal 80 just like the final RF amplifier stage 36C. The second final stage replica amplifier 94 is configured to generate the third feedback signal 124 such that a phase of the third feedback signal 124 matches the phase of the amplified RF signal 26. Since the third feedback signal 124 is not filtered by the output matching filter 84, the second harmonic filter 98 is configured to filter high-frequency harmonics from the third feedback signal 124 and increase the performance of the phase error detection circuit 100.

With regard to reference paths, the third harmonic filter 102 is configured to filter signal components (e.g., noise, harmonics) from the first reference signal 110 and increase the performance of the gain error detection circuit 88. In this manner, the input matching filter 74 can provide impedance matching with the source impedance $Z_S$ (shown in FIG. 1) while the third harmonic filter 102 removes unwanted signal components from the first reference signal 110. Similarly, the fourth harmonic filter 104 is configured to filter signal components (e.g., noise, harmonics) from the second reference signal 126 and increase the performance of the gain error detection circuit 88. In this manner, the input matching filter 74 can provide impedance matching with the source impedance $Z_S$ (shown in FIG. 1) while the fourth harmonic filter 104 removes unwanted signal components from the second reference signal 126.

Figure 5A:
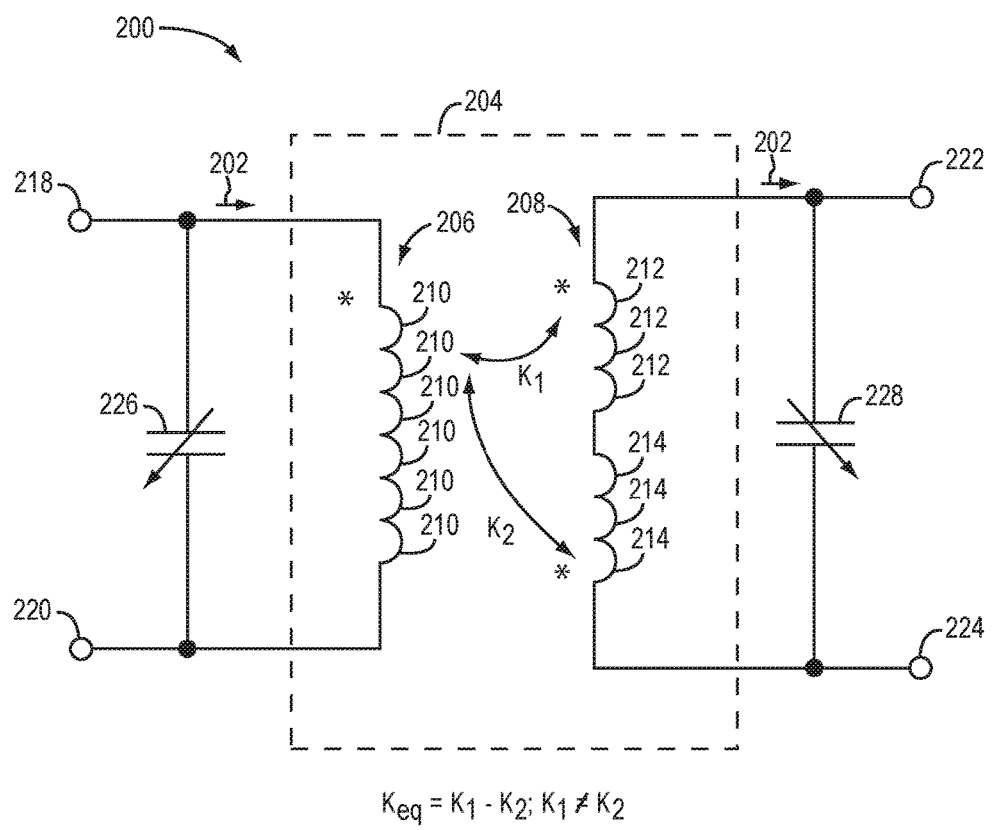
FIG. 5A illustrates an exemplary RF filter having an exemplary weak magnetically coupled inductor structure having a first inductor coil and a second inductor coil with weak magnetic coupling, wherein the RF filter may be used in the RF amplification device shown in FIG. 4 to filter an RF signal.

FIG. 5A illustrates an exemplary RF filter 200. The first harmonic filter 96, the second harmonic filter 98, the third harmonic filter 102, and the fourth harmonic filter 104 shown in FIG. 4 may be provided as embodiments of the RF filter 200. The RF filter 200 is configured to filter undesired signal components (e.g., harmonics and noise) from an RF signal 202. With respect to the first harmonic filter 96 shown in FIG. 4, the RF signal 202 is the first feedback signal 106. With respect to the second harmonic filter 98 shown in FIG. 4, the RF signal 202 is the third feedback signal 124.

Referring again to FIG. 5A, the RF filter 200 has a weak magnetically coupled inductor structure 204. The weak magnetically coupled inductor structure 204 includes a first inductor coil 206 and a second inductor coil 208 that are configured to have weak mutual magnetic coupling. In this manner, the weak magnetically coupled inductor structure 204 can provide high harmonic rejection. However, as explained in further detail below, the RF filter 200 can provide high harmonic rejection without consuming large amounts of space. Unlike in other weak magnetically coupled inductor structures, a distance between the first inductor coil 206 and the second inductor coil 208 does not have to be several times a diameter of either of the inductor coils 206, 208.

With respect to the third harmonic filter 102 shown in FIG. 4, the RF signal 202 is the first reference signal 110. With respect to the fourth harmonic filter 104 shown in FIG. 4, the RF signal 202 is the second reference signal 126. To avoid performance degradations in the closed-loop gain linearization circuit 50(1) and the closed-loop phase linearization circuit 52(1) shown in FIG. 4, the first harmonic filter 96, the second harmonic filter 98, the third harmonic filter 102, and the fourth harmonic filter 104 are formed in accordance with the topology of the RF filter 200 using the weak magnetically coupled inductor structure 204. In this embodiment, the RF filter 200 provides a weakly magnetically coupled LC network. As such, by using the topology of the RF filter 200, the first harmonic filter 96, the second harmonic filter 98, the third harmonic filter 102, and the fourth harmonic filter 104 can strongly attenuate out-of-band noise and harmonics, thereby allowing the closed-loop gain linearization circuit 50(1) and the closed-loop phase linearization circuit 52(1) to react to fundamental components of the first feedback signal 106, the first reference signal 110, the third feedback signal 124, and the second reference signal 126. The first feedback signal 106 and the third feedback signal 124 may be vulnerable to large harmonics and noise due to higher power levels. In some cases, even the first reference signal 110 and the second reference signal 126 may suffer from harmonics and noise due to parasitic mutual coupling or due to signal reflections coming from the initial RF amplifier stage 36A. In such cases, the third harmonic filter 102 and the fourth harmonic filter 104 are used to reduce the harmonics and noise for the closed-loop gain linearization circuit 50(1) and the closed-loop phase linearization circuit 52(1).

As shown in FIG. 5A, the first inductor coil 206 has one or more windings 210. In this embodiment, the first inductor coil 206 has more than one of the windings 210. However, the first inductor coil 206 may have any integer number of the windings 210 greater than or equal to one (1). In this manner, the first inductor coil 206 is configured to generate an electromagnetic field in response to the RF signal 202. Due to mutual coupling between the first inductor coil 206 and the second inductor coil 208, the RF signal 202 is transmitted to the second inductor coil 208.

As shown in FIG. 5A, the second inductor coil 208 includes one or more windings 212 and one or more windings 214. In the example shown in FIG. 5A, the second inductor coil 208 has more than one of the windings 212 and more than one of the windings 214. The second inductor coil 208 may have any integer number of the windings 212 greater than or equal to one (1) and may also have any integer number of the windings 214 greater than or equal to one (1). In FIG. 5A, the windings 212 of the second inductor coil 208 and the windings 214 of the second inductor coil 208 are mutually coupled to the windings 210 of the first inductor coil 206. However, the windings 212 and the windings 214 of the second inductor coil 208 are connected such that there is mutual magnetic coupling of the windings 212 with the windings 210 of the first inductor coil 206 and mutual magnetic coupling of the windings 214 with the windings 210 of the first inductor coil 206. More specifically, each of the windings 210 of the first inductor coil 206 is configured to generate a magnetic flux in response to the RF signal 202. The windings 212 and the windings 214 of the second inductor coil 208 are connected such that the magnetic flux induces opposing electromotive induction in the windings 212 and the windings 214 of the second inductor coil 208. As a result, the mutual magnetic couplings of the windings 212 with the windings 210 and the mutual magnetic couplings of the windings 214 with the windings 210 are in opposition. Therefore, the first inductor coil 206 and the second inductor coil 208 are configured to have a mutual magnetic coupling that is an aggregate of the mutual magnetic couplings of the windings 212 with the windings 210 and the mutual magnetic couplings of the windings 214 with the windings 210.

The mutual magnetic couplings of the windings 212 of the second inductor coil 208 with the windings 210 of the first inductor coil 206 aggregate to provide a mutual magnetic coupling $K_1$ between the first inductor coil 206 and the windings 212 of the second inductor coil 208. The mutual magnetic couplings of the windings 214 of the second inductor coil 208 with the windings 210 of the first inductor coil 206 aggregate to provide a mutual magnetic coupling $K_2$ between the first inductor coil 206 and the windings 214 of the second inductor coil 208. The mutual magnetic coupling $K_1$ and the mutual magnetic coupling $K_2$ are in opposition so as to provide an aggregate mutual magnetic coupling $K_{eq}$ (i.e., $K_1$-$K_2$) between the first inductor coil 206 and the second inductor coil 208. In this embodiment, the mutual magnetic coupling $K_1$ and the mutual magnetic coupling $K_2$ are not equal (i.e., $K_1 \neq K_2$). Therefore, the mutual magnetic coupling $K_1$ and the mutual magnetic coupling $K_2$ do not cancel and the RF signal 200 is transferred from the first inductor coil 206 to the second inductor coil 208 by a magnetic flux generated by the first inductor coil 206 in response to the RF signal 200.

To provide the mutual magnetic couplings of the windings 212 with the windings 210 and the mutual magnetic couplings of the windings 214 with the windings 210 in opposition, the windings 212 may be connected to the windings 214 such that the RF signal 202 propagates in substantially opposite rotational directions along the windings 212 and the windings 214. In some embodiments, the aggregate mutual magnetic coupling $K_{eq}$ between the first inductor coil 206 and the second inductor coil 208 is simply reduced. Thus, with regard to the weak magnetically coupled inductor structure 204 shown in FIG. 5A, the RF signal 202 may be transferred from the first inductor coil 206 to the second inductor coil 208 either entirely through the mutual magnetic coupling or through a combination of both the aggregate mutual magnetic coupling $K_{eq}$ and mutual electric coupling. Both magnetic tap (inductive) and electric tap (capacitive) can be used, including a combination of the two.

In the embodiment shown in FIG. 5A, the RF signal 202 is received by the first inductor coil 206 at input terminals 218, 220, while the RF signal 202 is transmitted from output terminals 222, 224 of the second inductor coil 208. A variable capacitive element 226 is connected to the first inductor coil 206 and a variable capacitive element 228 is connected to the second inductor coil 208. As such, the amplifier control circuit 38(1) may be configured to tune the RF filter 200 by varying the variable capacitances of each of the variable capacitive elements 226, 228. Note that in this embodiment, the variable capacitive element 226 is connected in parallel with the first inductor coil 206 and the variable capacitive element 228 is connected in parallel with the second inductor coil 208. However, the variable capacitive element 226 and the variable capacitive element 228 may be connected in different manners to the first inductor coil 206 and the second inductor coil 208. For example, the variable capacitive element 226 and/or the variable capacitive element 228 may be connected in series with the first inductor coil 206 and the second inductor coil 208, respectively. Additionally, the variable capacitive element 226 and/or the variable capacitive element 228 may be connected to form a tap with the first inductor coil 206 and the second inductor coil 208, respectively.

With respect to the RF filter 200 shown in FIG. 5A, the aggregate mutual magnetic coupling $K_{eq}$ between the first inductor coil 206 and the second inductor coil 208 can be provided using a variety of techniques. For example, in one exemplary topology, an equal number of the windings 212 and the windings 214 can be provided having mutual couplings in opposition, wherein at least one of the windings 212 and the windings 214 has a different size. Another exemplary topology provides different numbers of the windings 212 and the windings 214, but the windings 212, 214 are equal in size. Still another exemplary topology provides different numbers of the windings 212 and the windings 214, but the windings 212, 214 have different shapes. Additionally, alternative topologies may use combinations of any of the exemplary topologies described above.

Figure 5B:
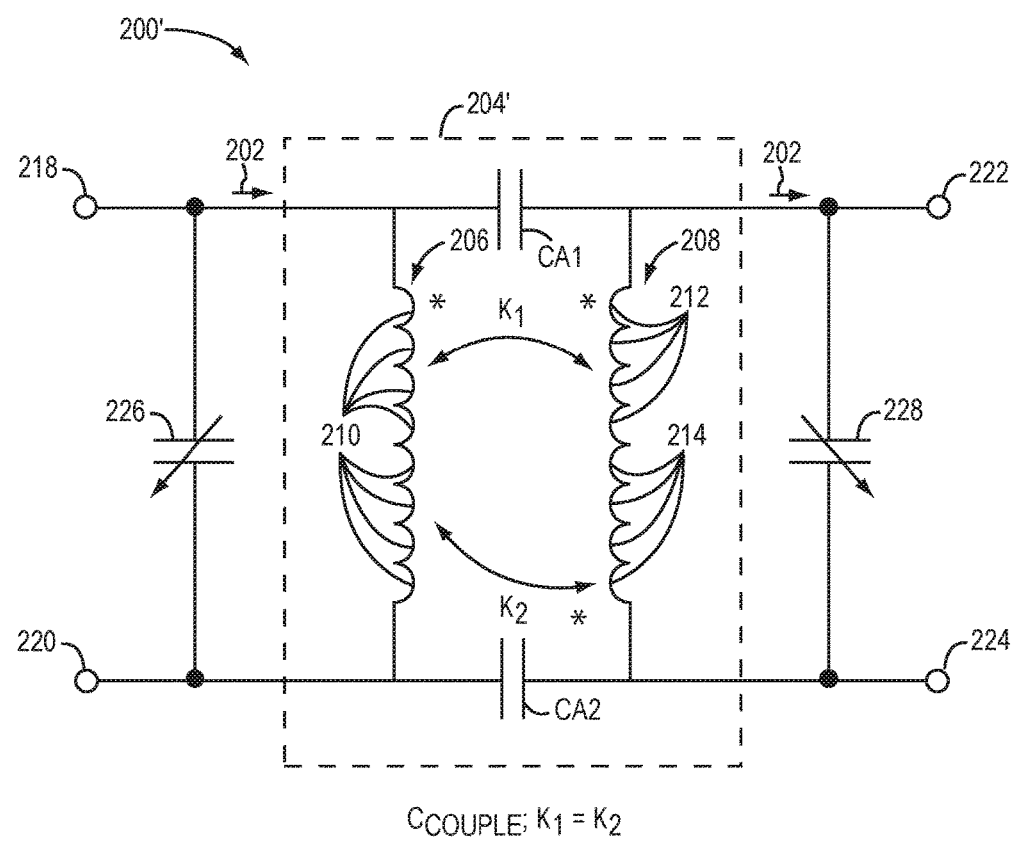
FIG. 5B illustrates another embodiment of an exemplary RF filter having another exemplary weak magnetically coupled inductor structure.

FIG. 5B illustrates another embodiment of an RF filter 200' that is similar to the RF filter 200 shown in FIG. 5A. The RF filter 200' includes the input terminals 218, 220, the output terminals 222, 224, and the variable capacitive elements 226, 228 described above with respect to FIG. 5A. The RF filter 200' shown in FIG. 5B further includes a weak magnetically coupled inductor structure 204'. The weak magnetically coupled inductor structure 204' is similar to the weak magnetically coupled inductor structure 204' shown in FIG. 5A and includes the first inductor coil 206 and the second inductor coil 208. However, the weak magnetically coupled inductor structure 204' shown in FIG. 5B further includes a coupling capacitive element CA1 and a coupling capacitive element CA2. Additionally, in this embodiment, the mutual magnetic coupling $K_1$ and the mutual magnetic coupling $K_2$ are equal (i.e., $K_1 \neq K_2$). Thus, the mutual magnetic couplings between the windings 212 of the second inductor coil 208 and the windings 210 of the first inductor coil 206 are in opposition to substantially cancel the aggregate mutual magnetic coupling $K_{eq}$ between the first inductor coil 206 and the second inductor coil 208. In this case, there is no or very little magnetic energy transfer between the first inductor coil 206 and the second inductor coil 208. Instead, the coupling capacitive element CA1 and the coupling capacitive element CA2 are configured to provide mutual electric coupling $C_{COUPLE}$ between the first inductor coil 206 and the second inductor coil 208. The first inductor coil 206 is configured to generate an electric flux that transfers the RF signal 202 to the second inductor coil 208 through the coupling capacitive element CA1 and the coupling capacitive element CA2. The coupling capacitive element CA1 is coupled between the first inductor coil 206 and the second inductor coil 208 so as to be in series with the input terminal 218 and the output terminal 222. The coupling capacitive element CA2 is coupled between the first inductor coil 206 and the second inductor coil 208 so as to be in series with the input terminal 220 and the output terminal 224.

Figure 6:
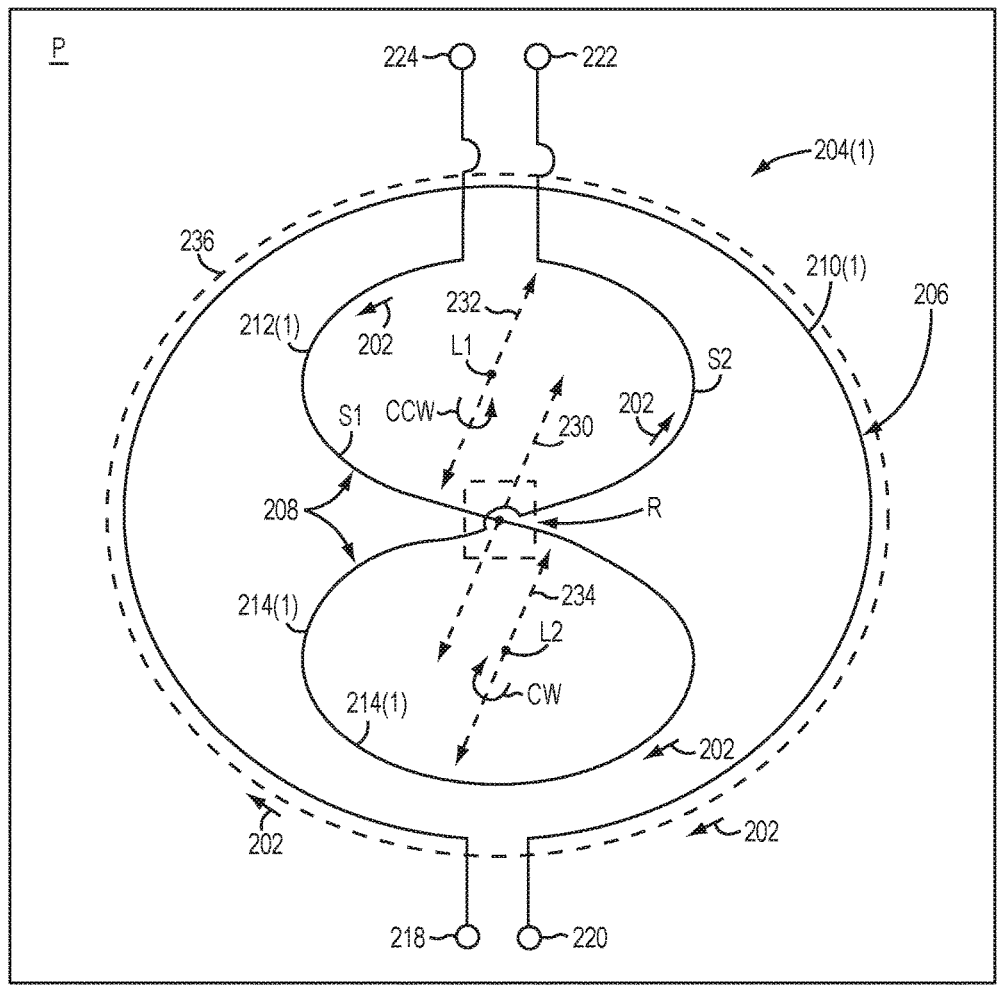
FIG. 6 illustrates one embodiment of the weak magnetically coupled inductor structure shown in FIG. 5A, wherein the first inductor coil has a first winding and the second inductor coil has a second winding and a third winding, and wherein a first mutual magnetic coupling between the second winding and the first winding and a second mutual magnetic coupling between the third winding and the first winding are in opposition.

FIG. 6 illustrates one embodiment of a weak magnetically coupled inductor structure 204(1), which is one embodiment of the weak magnetically coupled inductor structure 204 of the RF filter 200 shown in FIG. 5A. The first inductor coil 206 includes a winding 210(1), which is an embodiment of one of the windings 210 shown in FIG. 5A. However, in this embodiment, the first inductor coil 206 only has the single winding 210(1), rather than more than one of the windings 210 as in FIG. 5A. The second inductor coil 208 includes a winding 212(1), which is an embodiment of one of the windings 212 shown in FIG. 5A, and a winding 214(1), which is one embodiment of one of the windings 214 shown in FIG. 5A. However, in this embodiment, the second inductor coil 208 only has the single winding 212(1), rather than more than one of the windings 212 as in FIG. 5A, and the second inductor coil 208 only has the single winding 214(1), rather than more than one of the windings 214 as in FIG. 5A.

As shown in FIG. 6, the winding 210(1) is wound about an axis 230, where the axis 230 is perpendicular to a plane P defined by the winding 210(1). The winding 212(1) of the second inductor coil 208 is wound about an axis 232 and the winding 214(1) is wound about an axis 234. The axes 230, 232, 234 are substantially parallel to one another. The axis 232 and the axis 234 intersect the plane at displaced locations, L1, L2, respectively. Furthermore, a projection of the winding 212(1) of the second inductor coil 208 and a projection of the winding 214(1) of the second inductor coil 208 onto the plane P defined by the winding 210(1) are contained within a perimeter 236 of the winding 210(1) of the first inductor coil 206. In this manner, the first inductor coil 206 and the second inductor coil 208 are provided in a compact arrangement. In FIG. 6, the winding 210(1), the winding 212(1), and the winding 214(1) have a circular shape. However, any suitable winding shape is possible, including square(s), polygon(s) (e.g., octagon(s)), a multi-layer combination of straight and rounded edges, and/or the like.

The winding 212(1) has a first mutual magnetic coupling with the winding 210(1), and the winding 214(1) has a second mutual magnetic coupling with the winding 214(1). To provide weak mutual magnetic coupling, the winding 212(1) and the winding 214(1) are connected so as to be wound in opposite rotational directions. More specifically, the winding 212(1) is wound in a counterclockwise direction (CCW) so that the RF signal 202 propagates in the counterclockwise direction CCW along the winding 212(1). The winding 214(1) is wound in a clockwise direction (CW) so that the RF signal 202 propagates in the clockwise direction CW along the winding 214(1). In this manner, the winding 212(1) and the winding 214(1) of the second inductor coil 208 are connected such that the first mutual magnetic coupling and the second mutual magnetic coupling with the winding 210(1) of the first inductor coil 206 are in opposition. The area and/or perimeter of the winding 212(1) and the winding 214(1) may be different such that the mutual magnetic couplings with the winding 210(1) do not cancel. As such, the first inductor coil 206 and the second inductor coil 208 have weak mutual magnetic coupling, which results in net electric coupling in a given direction.

In some embodiments, the winding 212(1) and the winding 214(1) of the second inductor coil 208 are connected such that the first mutual magnetic coupling and the second mutual magnetic coupling are in opposition and substantially cancel the mutual magnetic coupling between the first inductor coil 206 and the second inductor coil 208. For example, an area enclosed by the winding 212(1) may be substantially equal to an area enclosed by the winding 214(1). As such, the winding 212(1) and the winding 214(1) may each have mutual electric coupling with the winding 210(1) to transfer the RF signal 202 from the first inductor coil 206 to the second inductor coil 208. In this case, the winding 212(1) may be configured so that a mutual electric coupling between the winding 212(1) and the winding 210(1) is symmetric with the mutual electric coupling between the winding 214(1) and the winding 210(1), which results in net electric coupling in a given direction.

In other embodiments, the winding 212(1) and the winding 214(1) of the second inductor coil 208 are connected such that the first mutual magnetic coupling and the second mutual magnetic coupling are in opposition, but do not substantially cancel the mutual magnetic coupling between the first inductor coil 206 and the second inductor coil 208. For example, the area enclosed by the winding 212(1) may be larger or smaller than the area enclosed by the winding 214(1). As such, the first mutual magnetic coupling and the second mutual magnetic coupling may transfer the RF signal 202 (or part of the RF signal 202). Additionally, the winding 212(1) and the winding 214(1) may each have mutual electric coupling with the winding 210(1) to also transfer the RF signal 202 (or a part of the RF signal 202) from the first inductor coil 206 to the second inductor coil 208. In this case, the winding 212(1) may be configured so that the mutual electric coupling between the winding 212(1) and the winding 210(1) is asymmetric with the mutual electric coupling between the winding 214(1) and the winding 210(1). This can be used to provide very small but controlled mutual coupling factors.

Note that the winding 212(1) and the winding 214(1) are wound around separate axes 232, 234, respectively, and thus are not coaxial. Also, the second inductor coil 208 is wound in the counterclockwise direction CCW so that the RF signal 202 propagates along a section S1 of the winding 212(1) in the counterclockwise direction CCW from the output terminal 224 to a locale R. At the locale R, the second inductor coil 208 is wound in the clockwise direction CW to form the winding 214(1), where the RF signal 202 propagates around the winding 214(1) in the clockwise direction CW back to the locale R. At the locale R, the second inductor coil 208 again is wound in the counterclockwise direction CCW to form a section S2 of the winding 212(1) from the locale R to the output terminal 222. As such, the RF signal 202 propagates along the section S2 from the locale R to the output terminal 222.

Figure 7:
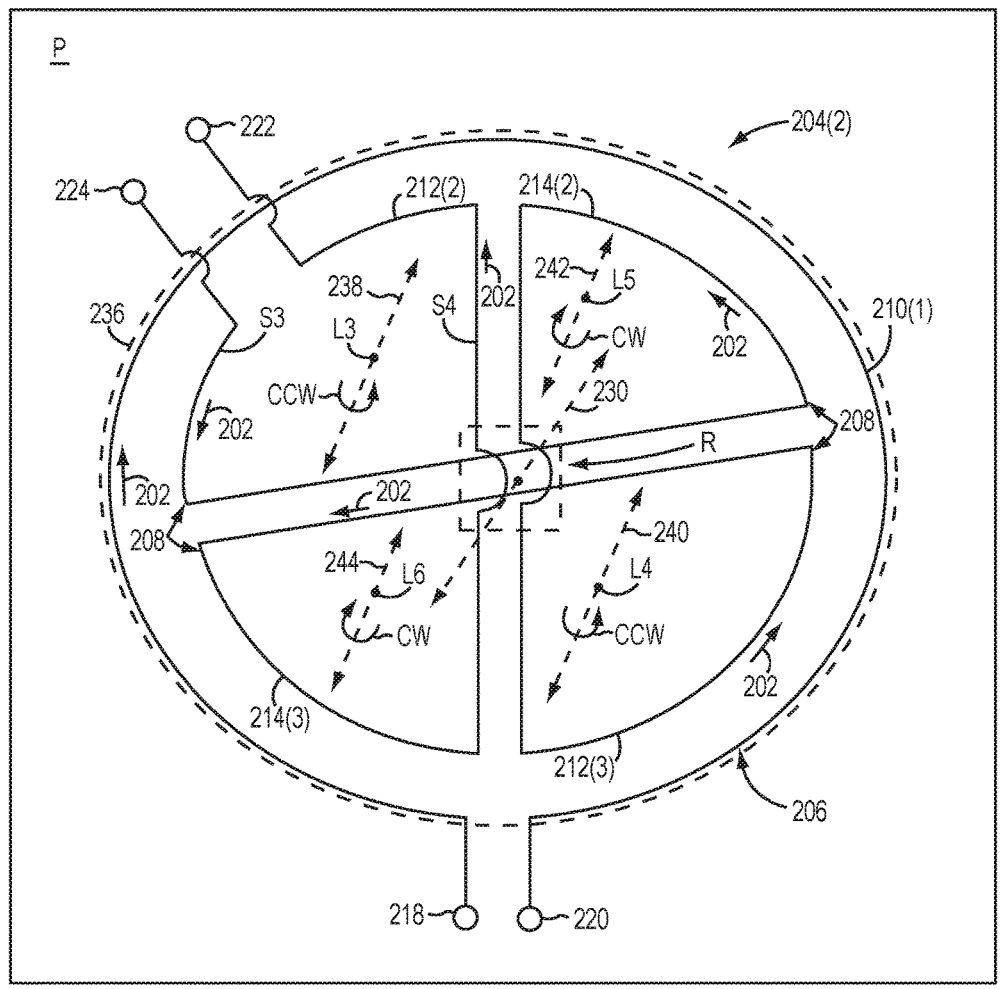
FIG. 7 illustrates another embodiment of the weak magnetically coupled inductor structure shown in FIG. 5A, wherein the first inductor coil has the first winding and the second inductor coil has two pairs of windings that are mutually coupled to the first winding in opposition.

FIG. 7 illustrates one embodiment of a weak magnetically coupled inductor structure 204(2), which is one embodiment of the weak magnetically coupled inductor structure 204 of the RF filter 200 shown in FIG. 5A. The first inductor coil 206 includes the winding 210(1) described above with respect to FIG. 6. However, in this embodiment, the second inductor coil 208 includes a winding 212(2) and a winding 212(3), each of which is an embodiment of one of the windings 212 shown in FIG. 5A, and a winding 214(2) and a winding 214(3), each of which is an embodiment of one of the windings 214 shown in FIG. 5A. The winding 212(2) of the second inductor coil 208 is wound about an axis 238, the winding 212(3) is wound about an axis 240, the winding 214(2) is wound about an axis 242, and the winding 214(3) is wound about an axis 244. The axes 230, 238, 240, 242, 244 are substantially parallel to one another. The axes 230, 238, 240, 242, 244 intersect the plane P at displaced locations L3, L4, L5, L6, respectively. Furthermore, a projection of the winding 212(2) of the second inductor coil 208, a projection of the winding 212(3) of the second inductor coil 208, a projection of the winding 214(2) of the second inductor coil 208, and a projection of the winding 214(3) of the second inductor coil 208 onto the plane P defined by the winding 210(1) are contained within the perimeter 236 of the winding 210(1) of the first inductor coil 206. In this manner, the first inductor coil 206 and the second inductor coil 208 are provided in a compact arrangement.

The winding 212(2) has a first mutual magnetic coupling with the winding 210(1), the winding 212(3) has a second mutual magnetic coupling with the winding 210(1), the winding 214(2) has a third mutual magnetic coupling with the winding 210(1), and the winding 214(3) has a fourth mutual magnetic coupling with the winding 210(1). To provide weak mutual magnetic coupling, the windings 212(2), 212(3) are each connected to the windings 214(2), 214(3) so as to be wound in opposite rotational directions. More specifically, the windings 212(2), 212(3) are each wound in the counterclockwise direction CCW so that the RF signal 202 propagates in the counterclockwise direction CCW along each of the windings 212(2), 212(3). The windings 214(2), 214(3) are wound in the clockwise direction CW so that the RF signal 202 propagates in the clockwise direction CW along each of the windings 214(2), 214(3). In this manner, the windings 212(2), 212(3) and the windings 214(2), 214(3) of the second inductor coil 208 are connected such that the first mutual magnetic coupling and the second mutual magnetic coupling with the winding 210(1) of the first inductor coil 206 are in opposition to the third mutual magnetic coupling and the fourth mutual magnetic coupling with the winding 210(1) of the first inductor coil 206. As such, the first inductor coil 206 and the second inductor coil 208 have weak mutual magnetic coupling.

In some embodiments, the windings 212(2), 212(3) each enclose an area of the same size, and the windings 214(2), 214(3) also each enclose an area of the same size. However, the area enclosed by each of the windings 212(2), 212(3) is somewhat larger than the area enclosed by each of the windings 214(2), 214(3). As such, the mutual magnetic coupling between the first inductor coil 206 and the second inductor coil 208, although weak, may be used to transfer the RF signal 202 (or part of the RF signal 202). Additionally, the windings 212(2), 212(3), 214(2), 214(3) may each have mutual electric coupling with the winding 210(1) to also transfer the RF signal 202 from the first inductor coil 206 to the second inductor coil 208. In this case, each of the mutual electric couplings between the windings 212(2), 212(3) and the winding 210(1) is asymmetric with respect to each of the mutual electric couplings between the windings 214(2), 214(3) and the winding 210(1).

Note that the windings 212(2), 212(3), 214(2), 214(3) are wound around separate axes 238, 240, 242, 244 respectively, and thus are not coaxial. Also, the second inductor coil 208 is wound in the counterclockwise direction CCW so that the RF signal 202 propagates along a section S3 of the winding 212(2) in the counterclockwise direction CCW from the output terminal 224 to the locale R. At the locale R, the second inductor coil 208 is wound in the clockwise direction CW to form the winding 214(2), where the RF signal 202 propagates around the winding 214(2) in the clockwise direction CW back to the locale R. At the locale R, the second inductor coil 208 is wound in the counterclockwise direction CCW to form the winding 212(3), where the RF signal 202 propagates around the winding 212(3) in the counterclockwise direction CCW back to the locale R. At the locale R, the second inductor coil 208 is wound in the clockwise direction CW to form the winding 214(3), where the RF signal 202 propagates around the winding 214(3) in the clockwise direction CW back to the locale R. At the locale R, the RF signal 202 again is wound in the counterclockwise direction CCW to form a section S4 of the winding 212(2) from the locale R to the output terminal 222. As such, the RF signal 202 propagates along the section S2 from the locale R to the output terminal 222.

Figure 8:
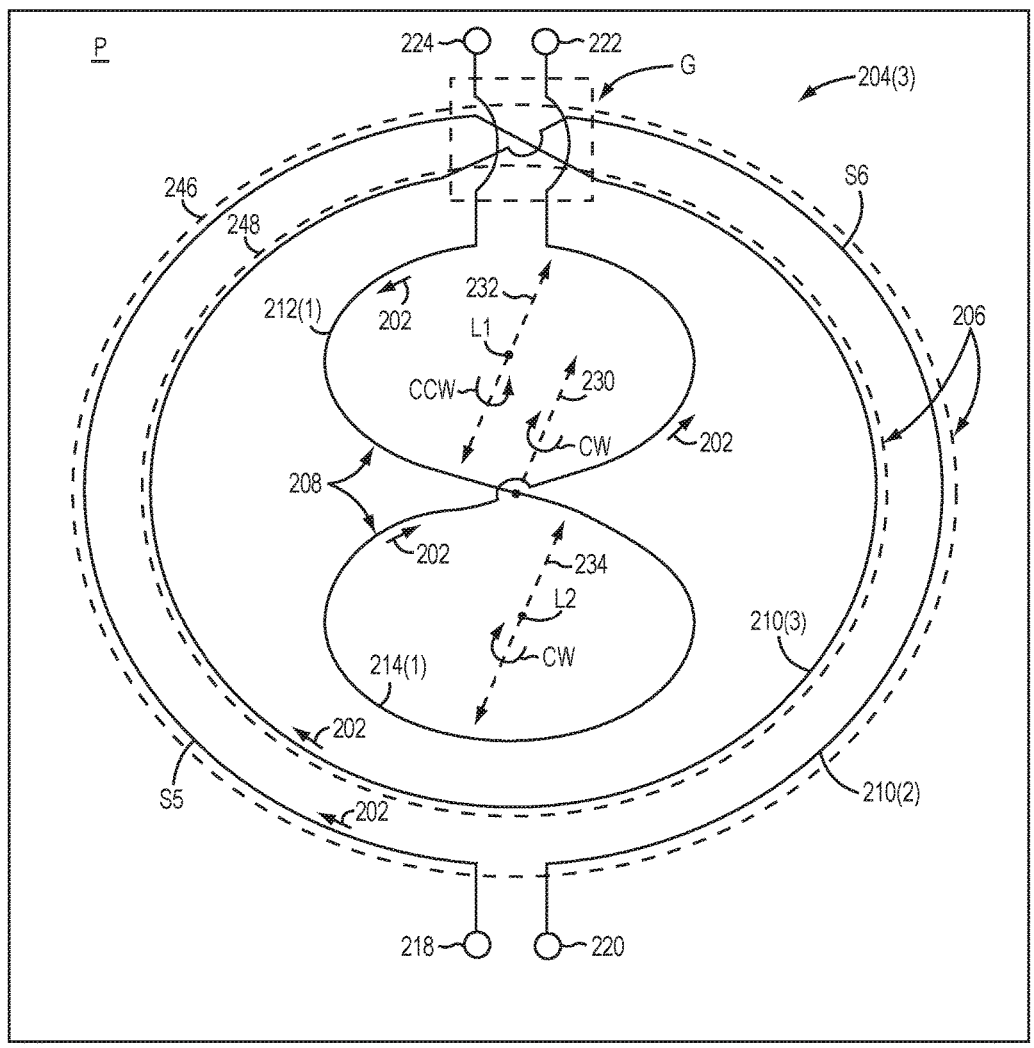
FIG. 8 illustrates yet another embodiment of the weak magnetically coupled inductor structure shown in FIG. 5A, wherein the first inductor coil has a pair of windings and the second inductor coil has another pair of windings.

FIG. 8 illustrates one embodiment of a weak magnetically coupled inductor structure 204(3), which is one embodiment of the weak magnetically coupled inductor structure 204 of the RF filter 200 shown in FIG. 5A. The first inductor coil 206 includes a winding 210(2) and a winding 210(3), each of which is an embodiment of one of the windings 210 shown in FIG. 5A. The windings 210(2), 210(3) are each wound about the axis 230, where the axis 230 is perpendicular to the plane P defined by the windings 210(2), 210(3). Each of the windings 210(2), 210(3) is also wound in the clockwise direction CW so that the RF signal 202 propagates in the clockwise direction CW along each of the windings 210(2), 210(3) of the first inductor coil 206. However, in this embodiment, a perimeter 246 of the winding 210(2) is larger than a perimeter 248 of the winding 210(3), and the winding 210(3) is therefore enclosed by the winding 210(2). In this embodiment, the windings 210(2), 210(3) are circular windings. However, the windings 210(2), 210(3) may have any shape.

Also, the first inductor coil 206 is wound in the clockwise direction CW so that the RF signal 202 propagates along a section S5 of the winding 210(2) in the clockwise direction CW from the input terminal 218 to a locale G. At the locale G, the first inductor coil 206 continues to be wound in the clockwise direction CW but is displaced from the perimeter 246 to the perimeter 248 to form the winding 210(3), where the RF signal 202 propagates around the winding 210(3) in the clockwise direction CW back to the locale G. At the locale G, the first inductor coil 206 continues to be wound in the clockwise direction CW but is displaced from the perimeter 248 back to perimeter 246 to form the section S6 of the winding 210(2), where the RF signal 202 propagates along the section S6 to the input terminal 220.

With respect to the second inductor coil 208, the second inductor coil 208 includes the winding 212(1) and the winding 214(1) described above with respect to FIG. 6. Both the projection of the winding 212(1) and the projection of the winding 214(1) of the second inductor coil 208 onto the plane P defined by the windings 210(2), 210(3) are contained within the perimeter 248 and thus also within the perimeter 246, since the perimeter 246 is larger than the perimeter 248. In this manner, the first inductor coil 206 and the second inductor coil 208 are provided in a compact arrangement, while providing weak mutual coupling.

To provide for weak mutual magnetic coupling between the first inductor coil 206 and the second inductor coil 208, the winding 212(1) of the second inductor coil 208 has a first mutual magnetic coupling with the winding 210(2) and a second mutual magnetic coupling with the winding 210(3) of the first inductor coil 206, while the winding 214(1) of the second inductor coil 208 has a third mutual magnetic coupling with the winding 210(2) and a fourth mutual magnetic coupling with the winding 210(3) of the first inductor coil 206. The winding 212(1) is connected to the winding 214(1) by the second inductor coil 208 such that the winding 212(1) and the winding 214(1) are wound in opposite rotational directions. In this manner, the first mutual magnetic coupling and the second mutual magnetic coupling are in opposition to the third mutual magnetic coupling and the fourth mutual magnetic coupling. As such, the first inductor coil 206 and the second inductor coil 208 have weak mutual magnetic coupling. A size of the area enclosed by the winding 212(1) with respect to a size of the area enclosed by the winding 214(1) determines how much mutual magnetic coupling there is between the first inductor coil 206 and the second inductor coil 208, as described above with respect to FIG. 6. Also, similar to the embodiment described above with respect to FIG. 6, the windings 212(1), 214(1) of the second inductor coil 208 may each have a mutual electric coupling with each of the windings 210(2), 210(3) of the first inductor coil 206 in order to transfer the RF signal 202 between the first inductor coil 206 and the second inductor coil 208.

Figure 9:
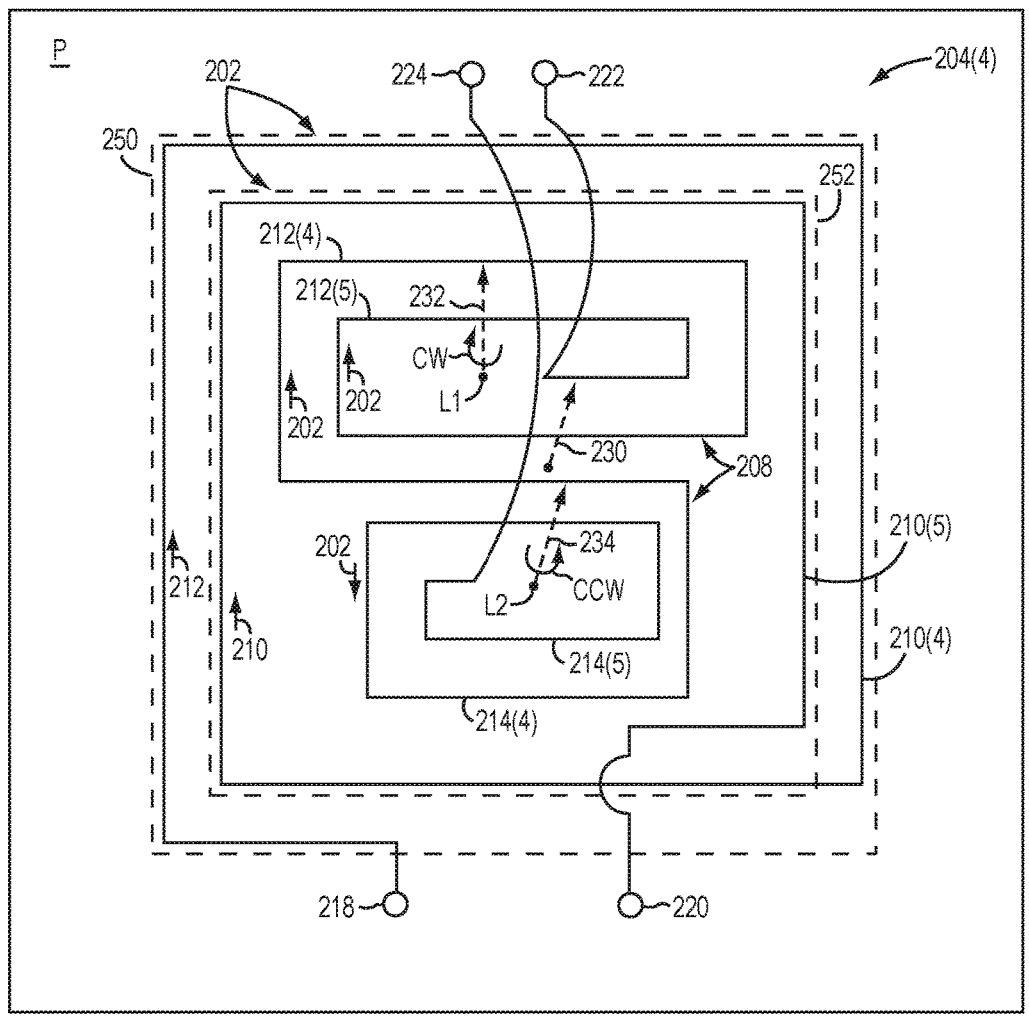
FIG. 9 illustrates still another embodiment of the weak magnetically coupled inductor structure shown in FIG. 5A, wherein the second inductor coil has a pair of windings wound about the same axis and another pair of windings wound about the same axis, wherein the pair of windings and the other pair of windings of the second inductor coil are mutually magnetically coupled in opposition with a pair of windings in the first inductor coil.

FIG. 9 illustrates one embodiment of a weak magnetically coupled inductor structure 204(4), which is one embodiment of the weak magnetically coupled inductor structure 204 of the RF filter 200 shown in FIG. 5A. The first inductor coil 206 includes a winding 210(4) and a winding 210(5), each of which is an embodiment of one of the windings 210 shown in FIG. 5A. The windings 210(4), 210(5) are each wound about the axis 230, where the axis 230 is perpendicular to the plane P defined by the windings 210(4), 210(5). Each of the windings 210(4), 210(5) is also wound in the clockwise direction CW so that the RF signal 202 propagates in the clockwise direction CW along each of the windings 210(4), 210(5) of the first inductor coil 206. However, in this embodiment, a perimeter 250 of the winding 210(4) is larger than a perimeter 252, and the winding 210(5) is enclosed by the winding 210(4). Also, each of the windings 210(4), 210(5) shown in FIG. 9 is a parallelogram, and in particular, is rectangular.

With regard to the embodiment of the second inductor coil 208 shown in FIG. 9, the second inductor coil 208 includes a winding 212(4) and a winding 212(5), each of which is an embodiment of one of the windings 212 shown in FIG. 5A, and a winding 214(4) and a winding 214(5), each of which is an embodiment of one of the windings 214 shown in FIG. 5A. The winding 212(4) and the winding 212(5) of the second inductor coil 208 are each wound about the axis 232 at the displaced location L1 in the clockwise direction CW so that the RF signal 202 propagates in the clockwise direction CW along the windings 212(4), 212(5). Thus, the windings 212(4), 212(5) are coaxial. In this case, a perimeter (not explicitly marked for the sake of clarity) and an area (not explicitly marked for the sake of clarity) of the winding 212(4) are greater than a perimeter (not explicitly marked for the sake of clarity) and an area (not explicitly marked for the sake of clarity) of the winding 212(5). In contrast, the winding 214(4) and the winding 214(5) of the second inductor coil 208 are each wound about the axis 234 at the displaced location L2 in the counterclockwise direction CCW so that the RF signal 202 propagates in the counterclockwise direction CCW along the windings 214(4), 214 (5). Thus, the windings 214(4), 214(5) are coaxial. In this case, a perimeter (not explicitly marked for the sake of clarity) of the winding 214(4) is greater than a perimeter (not explicitly marked for the sake of clarity) of the winding 214(5). Furthermore, a projection of the winding 212(4), a projection of the winding 212(5), a projection of the winding 214(4), and a projection of the winding 214(5) of the second inductor coil 208 onto the plane P defined by the windings 210(4), 210(5) are contained within the perimeter 252 of the winding 210(5) of the first inductor coil 206, and thus also within the perimeter 250. In this manner, the first inductor coil 206 and the second inductor coil 208 are provided in a compact arrangement.

The winding 212(4) has a first mutual magnetic coupling with the winding 210(4), the winding 212(5) has a second mutual magnetic coupling with the winding 210(4), the winding 212(4) has a third mutual magnetic coupling with the winding 210(5), the winding 212(5) has a fourth mutual magnetic coupling with the winding 210(5), the winding 214(4) has a fifth mutual magnetic coupling with the winding 210(4), the winding 214(5) has a sixth mutual magnetic coupling with the winding 210(4), the winding 214(4) has a seventh mutual magnetic coupling with the winding 210(5), and the winding 214(5) has an eighth mutual magnetic coupling with the winding 210(5). To provide weak mutual magnetic coupling, the windings 212(4), 212(5) are connected to the windings 214(4), 214(5) so as to be wound in opposite rotational directions. In this manner, the windings 212(2), 212(3) and the windings 214(4), 214(5) of the second inductor coil 208 are connected such that the first mutual magnetic coupling, the second mutual magnetic coupling, the third mutual magnetic coupling, and the fourth mutual magnetic coupling are in opposition to the fifth mutual magnetic coupling, the sixth mutual magnetic coupling, the seventh mutual magnetic coupling, and the eighth mutual magnetic coupling. As such, the first inductor coil 206 and the second inductor coil 208 have weak mutual magnetic coupling. A size of an area and/or perimeter enclosed by each of the windings 212(4), 212(5) with respect to a size of an area and/or perimeter enclosed by each of the windings 214(4), 214(5) determines how much mutual magnetic coupling there is between the first inductor coil 206 and the second inductor coil 208. Also, similar to the embodiment described above with regard to FIG. 6, the windings 212(4), 212(5), 214(4), 214(5) of the second inductor coil 208 may each have a mutual electric coupling with each of the windings 210(4), 210(5) of the first inductor coil 206 in order to transfer the RF signal 202 between the first inductor coil 206 and the second inductor coil 208.

Figure 10A:
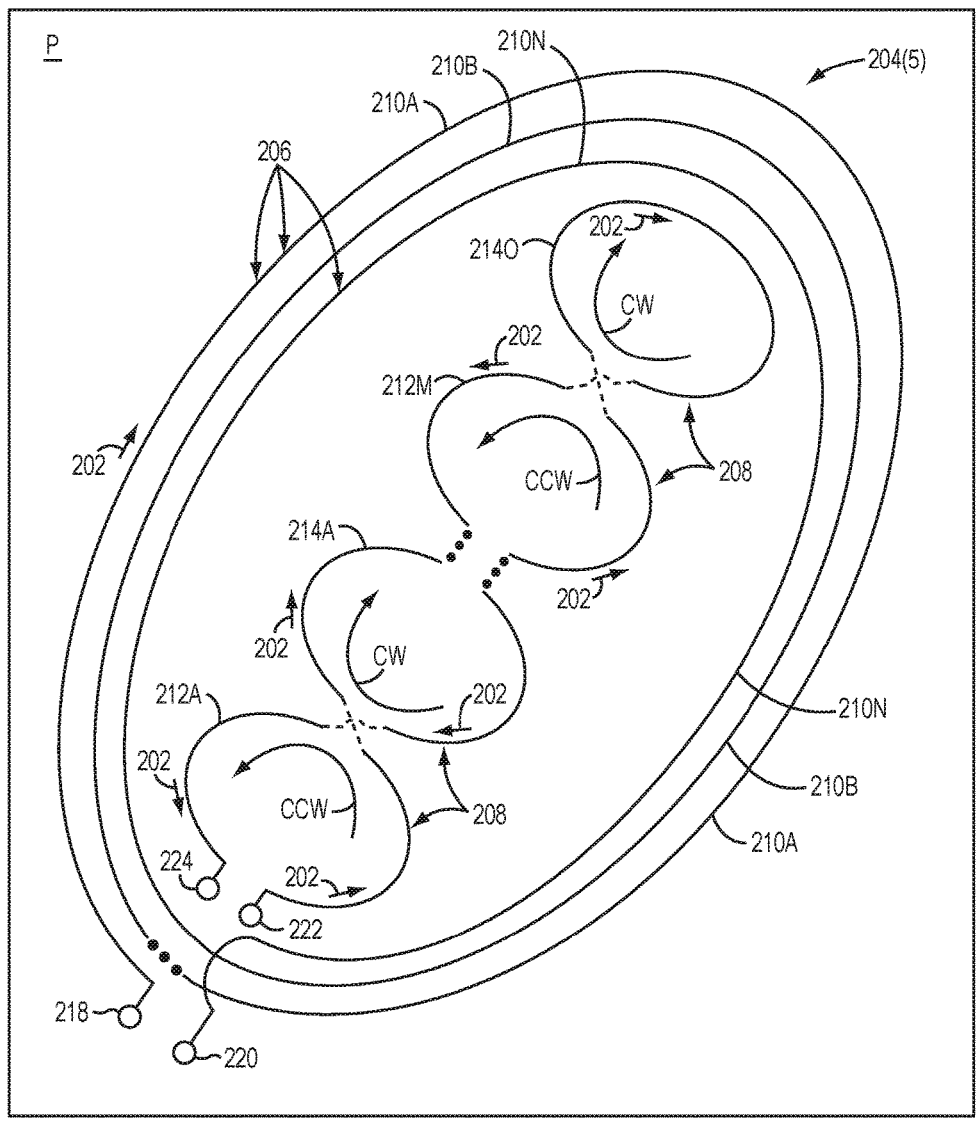
FIG. 10A illustrates another embodiment of the weak magnetically coupled inductor structure shown in FIG. 5A, wherein the first inductor coil includes any number of windings and the second inductor coil includes any number of windings mutually magnetically coupled in opposition to the windings of the first inductor coil.

FIG. 10A illustrates one embodiment of a weak magnetically coupled inductor structure 204(5), which is one embodiment of the weak magnetically coupled inductor structure 204 of the RF filter 200 shown in FIG. 5A. The first inductor coil 206 includes windings 210A-210N, which are embodiments of the windings 210 shown in FIG. 5A. As such, the first inductor coil 206 has N number of windings 210A-210N, where N is any integer greater than or equal to one (1). In this embodiment, each of the windings 210A-210N is concentric, where a perimeter (not explicitly marked for the sake of clarity) of each of the windings 210A-210N increases from the winding 210A to the winding 210N. The windings 210A-210N are elliptical, but alternatively may be of any shape.

With regard to the embodiment of the second inductor coil 208 shown in FIG. 10A, the second inductor coil 208 includes windings 212A-212M and 214A-214O. As such, the second inductor coil 208 has M number of windings 212A-212M, where M is an integer greater than or equal to one (1). The windings 212A-212M are each elliptical in shape, but alternatively may be of any shape. The second inductor coil 208 has O number of windings 214A-214O, where O is an integer greater than or equal to one (1). The windings 214A-214O are configured so that the RF signal 202 propagates in the counterclockwise direction CCW, but propagates in the clockwise direction CW along each of the windings 214A-214O. A projection of each of the windings 212A-212M, 214A-214O of the second inductor coil 208 onto the plane P defined by the windings 210A-210N is within a perimeter of the winding 210N, which has the smallest perimeter. Thus, the projection of each of the windings 212A-212M, 214A-214O of the second inductor coil 208 is also within the perimeters of all of the windings 210A-210N. In this manner, the first inductor coil 206 and the second inductor coil have a compact topology while providing weak mutual magnetic coupling between the first inductor coil 206 and the second inductor coil 208.

As mentioned above, the N number of the windings 210A-210N, the M number of the windings 212A-212M, and the 0 number of the windings 214A-214O may each be arbitrary numbers. An order of the windings 212A-212M and of the windings 214A-214O can also be arbitrary. In FIG. 10A, the windings 212A-212M and the windings 214A-214O are shown in an alternating order, but any combination of the windings 212A-212M and of the windings 214A-214O may be provided. An equivalent magnetic coupling may be set by sizes, areas, and/or perimeters of the windings 212A-212M and of the windings 214A-214O, since their mutual magnetic couplings with the windings 210A-210N are in opposition.

Figure 10B:
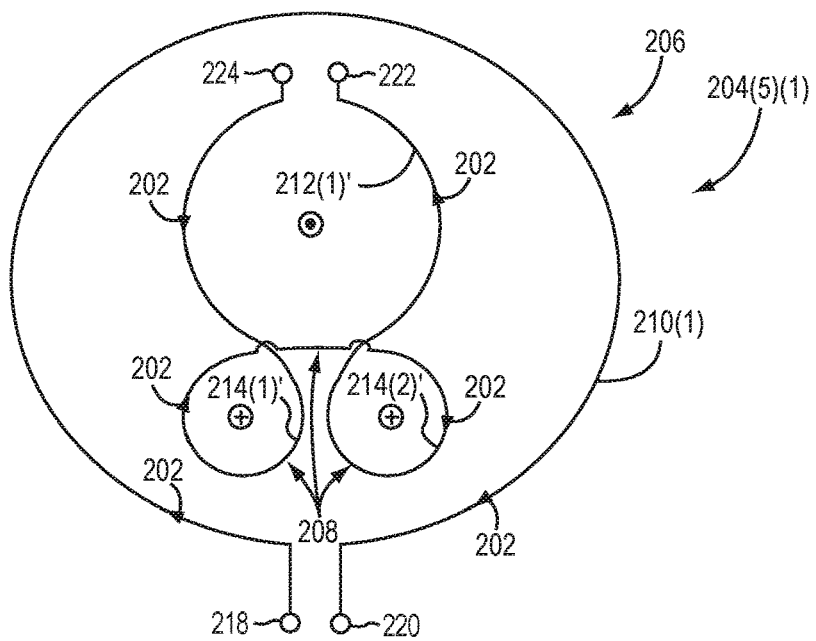
FIGS. 10B-10D illustrate different examples of the weak magnetically coupled inductor structure shown in FIG. 10A.
Figure 10C:
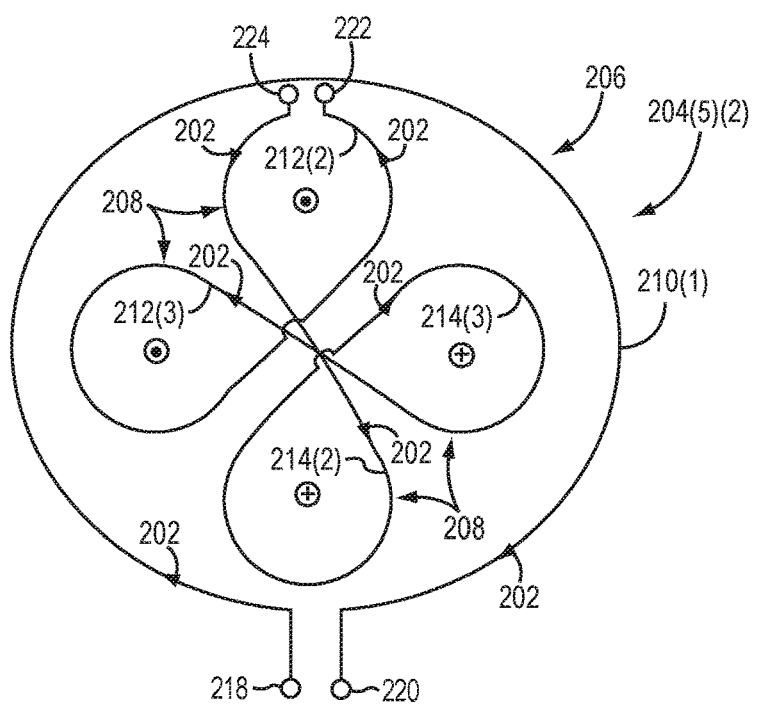
Figure 10D:
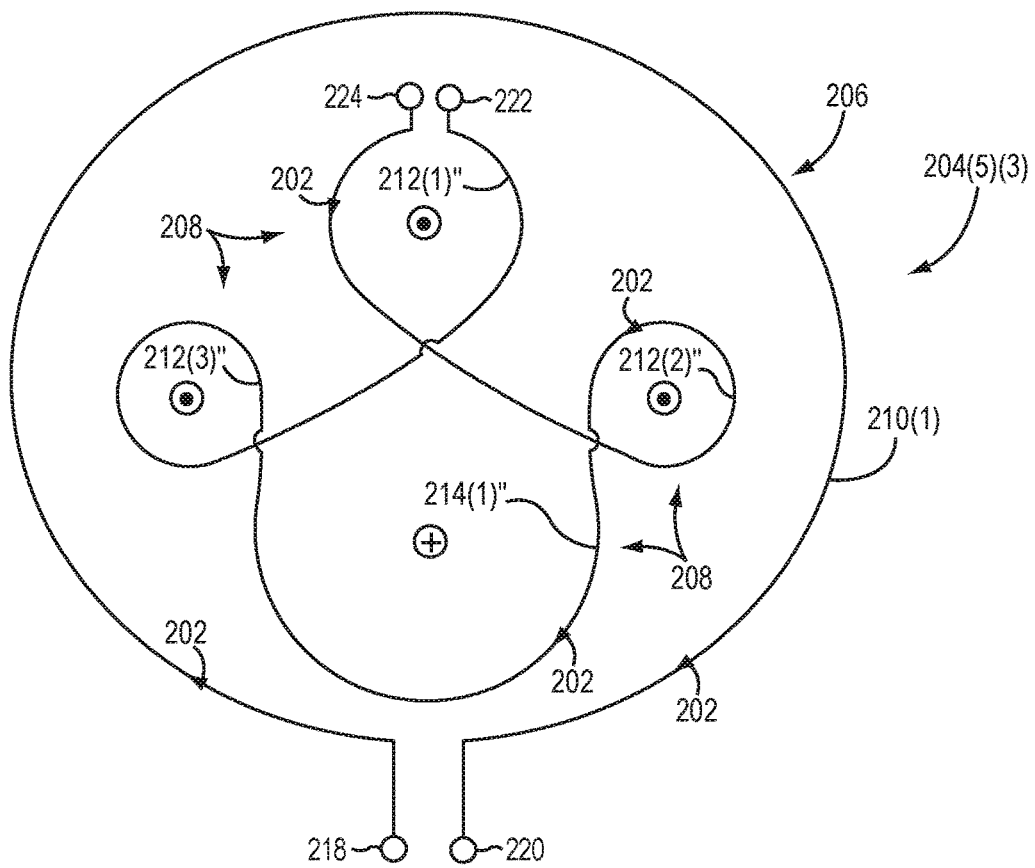

FIGS. 10B-10D illustrate different embodiments of the weak magnetically coupled inductor structure 204(5) shown in FIG. 10A. Throughout FIGS. 10B-10D, circled dots and circled plus signs indicate axes and their locales. The circled dots further indicate that the respective winding is wound in the counterclockwise direction CCW, while the circled plus signs indicate that the respective winding is wound in the clockwise direction CW. With regard to FIG. 10B, FIG. 10B illustrates an embodiment of a weak magnetically coupled inductor structure 204(5)(1). The first inductor coil 206 includes the winding 210(1). The second inductor coil 208 includes a winding 212(1)', a winding 214(1)', and a winding 214(2)'. The winding 212(1)' is large with respect to each of the windings 214(1)', 214(2)'. Thus, the second inductor coil 208 includes one large winding 212(1)' wound in the counterclockwise direction CCW and the two windings 214(2)' wound in the clockwise direction CW.

FIG. 10C illustrates another embodiment of a weak magnetically coupled inductor structure 204(5)(2). The weak magnetically coupled inductor structure 204(5)(2) is similar to the weak magnetically coupled inductor structure 204(2) shown in FIG. 7, except that the windings 212(2), 212(3) and the windings 214(2), 214(3) are grouped together instead of alternating and may be of different sizes. The first inductor coil 206 includes the winding 210(1).

FIG. 10D illustrates another embodiment of a weak magnetically coupled inductor structure 204(5)(3). In this embodiment, the second inductor coil 208 includes windings 212(1)", 212(2)", 212(3)", and a winding 214(1)". Sizes for the windings 212(1)", 212(2)", 212(3)" may not be the same. The first inductor coil 206 includes the winding 210(1). A sum of mutual magnetic couplings between the windings 212(1)", 212(2)", 212(3)" and the winding 210(1) differs in magnitude from a mutual magnetic coupling between the winding 214(1)" and the winding 210(1), thereby resulting in a net aggregate weak magnetic coupling in a given direction. This is an example of unequal sizes among the windings in each group and between the groups. This is also an example of an unequal number of the windings 212(1)", 212(2)", 212(3)" and the winding 214(1)".

Figure 11:
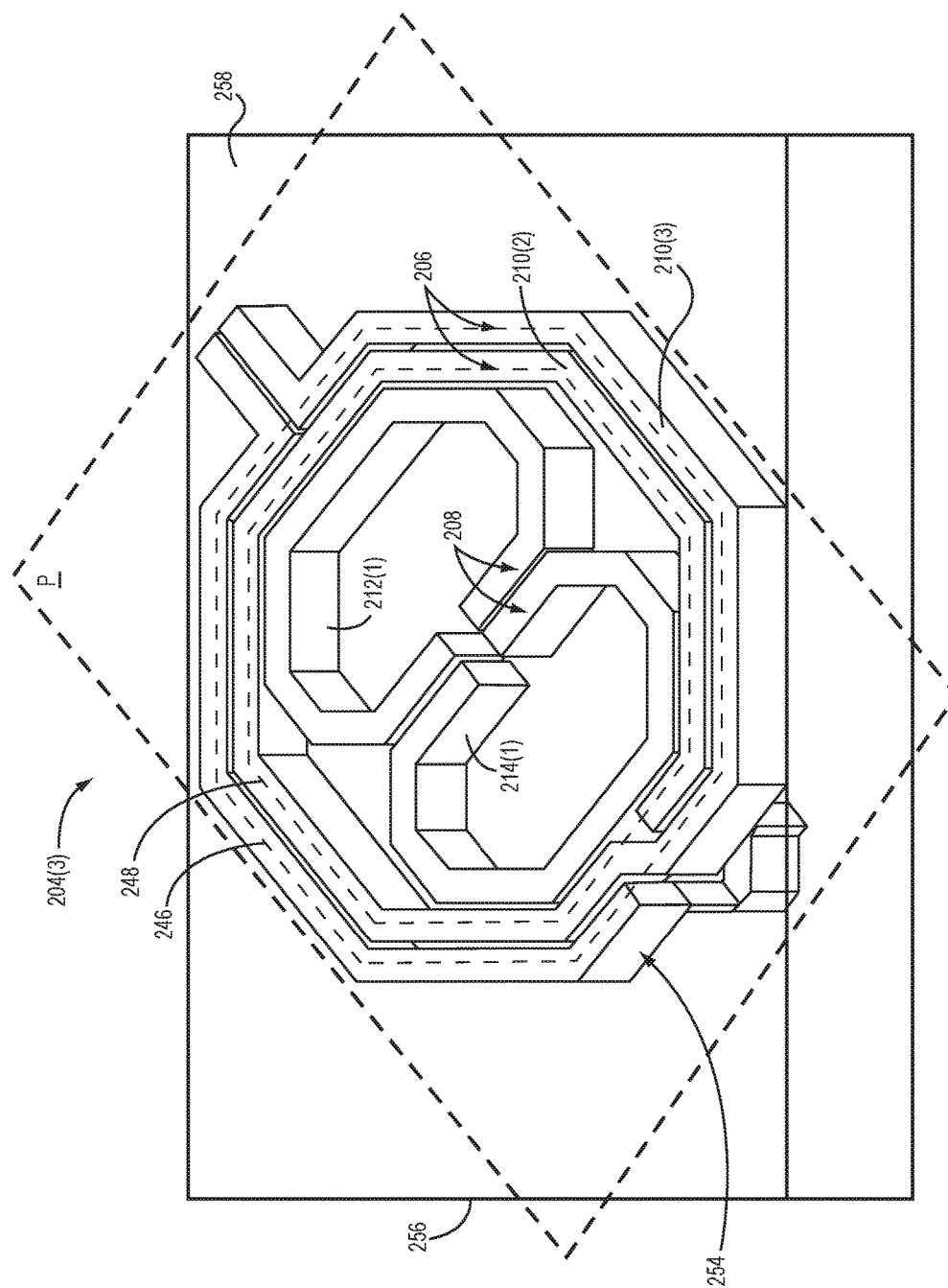
FIG. 11 illustrates a physical topology of the weak magnetically coupled inductor structure shown in FIG. 8 formed by a metallic layer in a substrate.

FIG. 11 illustrates an exemplary physical topology of one embodiment of the weak magnetically coupled inductor structure 204(3) shown in FIG. 8. In this embodiment, the weak magnetically coupled inductor structure 204(3) is formed by a metallic layer 254 formed with a substrate 256. For example, the substrate 256 may be provided as the package board 62, the BEOL 68, or the semiconductor substrate 66 shown in FIG. 2. In this embodiment, the metallic layer 254 is on a surface 258 of the substrate 256. The plane P defined by the windings 210(2) and 210(3) is therefore above and parallel to the surface 258. Note that in this embodiment, the winding 212(1) and the winding 214(1) of the second inductor coil 208 are each in the plane P and enclosed within the perimeters 246, 248 of the windings 210(2), 210(3). Thus, the projections of the winding 212(1) and the winding 214(1) onto the plane P are in the plane P.

Realizing the first inductor coil 206 and the second inductor coil 208 in the same plane P (e.g., using the same metallic layer 254) is inexpensive since it reduces the number of metallic layers (such as the metallic layer 254) required to build the weak magnetically coupled inductor structure 204(3). In some embodiments, the metallic layer 254 used to form the first inductor coil 206 and the second inductor coil 208 may be thicker than other typical metallic layers in the substrate 256. Although this may increase cost, having the windings 210(2), 210(3), 212(1), 214(1) in the same plane P allows for the winding 212(1) and the winding 214(1) to enclose a smaller area. In some embodiments, this may result in larger losses and a lower quality factor, which may translate into potentially out-of-band attenuation.

Figure 12:
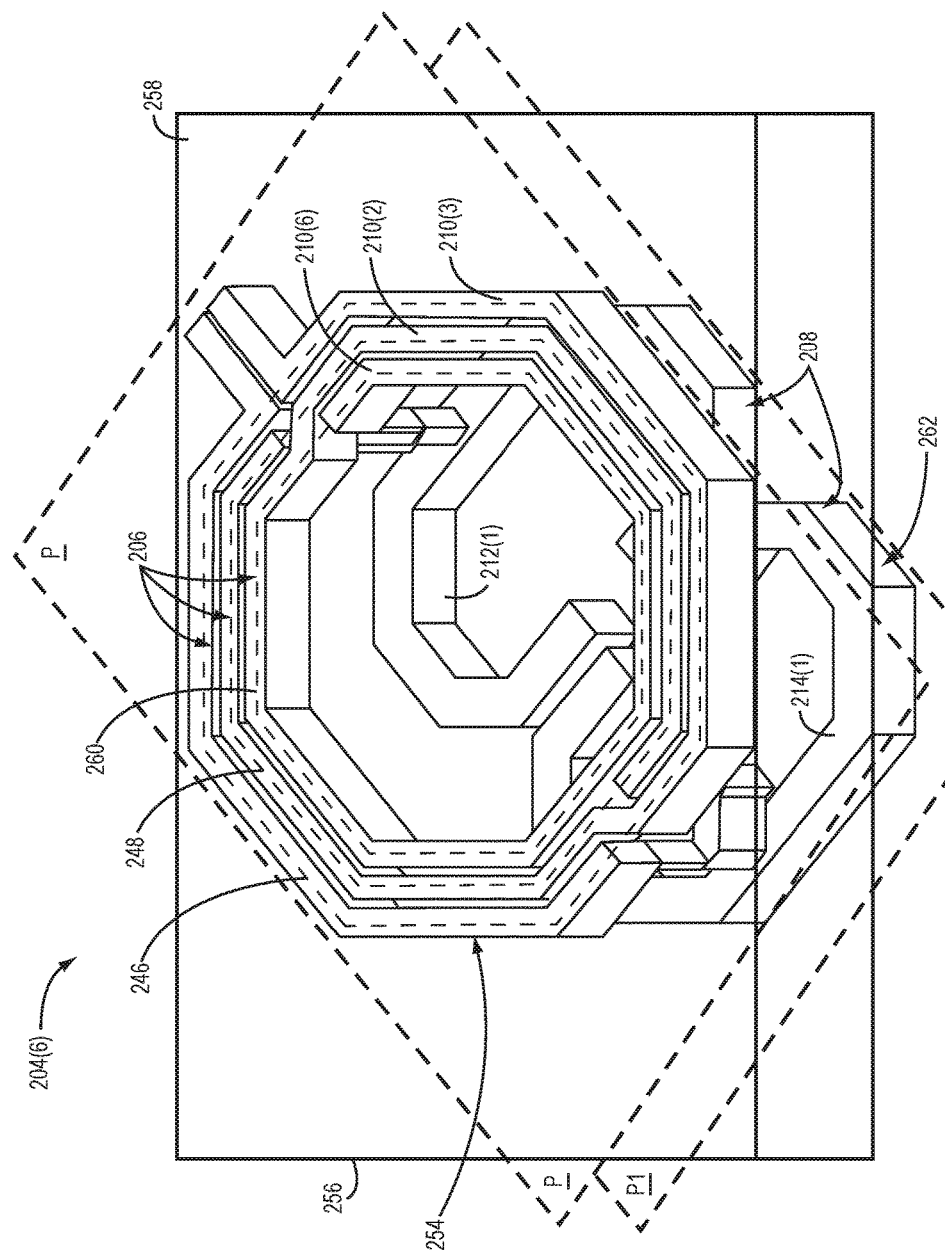
FIG. 12 illustrates a physical topology of a weak magnetically coupled inductor structure similar to the weak magnetically coupled inductor structure shown in FIG. 8 and formed on different metallic layers of the substrate.

FIG. 12 illustrates an exemplary topology of another exemplary weak magnetically coupled inductor structure 204(6), which is another embodiment of the weak magnetically coupled inductor structure 204 shown in FIG. 5A. The weak magnetically coupled inductor structure 204(6) is the same as the weak magnetically coupled inductor structure 204(3) shown in FIG. 8, except that the first inductor coil 206 shown in FIG. 12 includes an additional winding 210(6). Also, a projection of the winding 212(1) of the second inductor coil 208 and a projection of the winding 214(1) of the second inductor coil 208 onto the plane P defined by the windings 210(2), 210(3), 210(6) are enclosed only within the perimeter 246 of the winding 210(2), and not within the perimeter 248 of the winding 210(3), or a perimeter 260 of the winding 210(6).

In this embodiment, the weak magnetically coupled inductor structure 204(6) is also formed with the substrate 256. However, while the windings 210(2), 210(3), 210(6) of the first inductor coil 206 are formed by the metallic layer 254 on the surface 258 of the substrate 256, the windings 212(1), 214(1) of the second inductor coil 208 are formed by a metallic layer 262, not the metallic layer 254. The windings 212(1), 214(1) are thus in a plane P1 that is substantially parallel to but below the plane P. The projection of the winding 212(1) and the projection of the winding 214(1) onto the plane P defined by the windings 210(2), 210(3), 210(6) of the first inductor coil 206 are enclosed in the perimeter 246 of the winding 210(2). Therefore, the winding 212(1) and the winding 214(1) are provided in a compact arrangement. However, since the windings 212(1) and 214(1) are wound in opposite rotational directions (as explained above with respect to FIG. 8), the first inductor coil 206 and the second inductor coil 208 have weak mutual magnetic coupling. To achieve a higher quality factor with the weak magnetically coupled inductor structure 204(6), the windings 210(2), 210(3), 210(6) of the first inductor coil 206 and the windings 212(1), 214(1) of the second inductor coil 208 are formed with the different metallic layers 254, 262.

With regard to the IC package 14 illustrated in FIG. 2, the weak magnetically coupled inductor structure 204(6) of FIG. 12 may be provided with the first inductor coil 206 in one metallic layer (e.g., the metallic layer 254) and the second inductor coil 208 may be provided in another metallic layer (e.g., the metallic layer 262). This allows for an area of the second inductor coil 208 to be larger and thus achieve a higher quality factor.

In alternative embodiments, more than two metallic layers can be used. For example, one of the inductor coils 206, 208 can be formed using more than two metallic layers. The inductor coils 206, 208 can also be implemented using separate groups of metallic layers, or they can be intermingled. The multiple metallic layers can all be realized in the same processing flow (e.g., semiconductor IC, laminate, integrated passive die (IPD), etc.), or they may be realized in different processing flows and the weakly coupled inductor structures formed through assembly. For example, one of the inductor coils 206, 208 may be realized on a silicon (Si) die and the other one of the inductor coils 206, 208 may be realized on a laminate or IPD.

Those skilled in the art will recognize improvements and modifications to the embodiments of the present disclosure. All such improvements and modifications are considered within the scope of the concepts disclosed herein and the claims that follow.

What is claimed is:
1. A radio frequency (RF) filter comprising:
a first inductor coil having a first winding;
a second inductor coil having a second winding, a third winding, a fourth winding, and a fifth winding, wherein:
the second winding is configured to have a first mutual magnetic coupling with the first winding of the first inductor coil;
the third winding is configured to have a second mutual magnetic coupling with the first winding of the first inductor coil; and
the second winding is connected to the third winding such that the first mutual magnetic coupling and the second mutual magnetic coupling are in opposition.

2. The RF filter of claim 1 wherein:
the first winding of the first inductor coil is configured to generate a magnetic flux in response to an RF signal; and
the second winding and the third winding of the second inductor coil are connected such that the magnetic flux induces opposing electromotive induction in the second winding and the third winding so that the first mutual magnetic coupling and the second mutual magnetic coupling are in opposition.

3. The RF filter of claim 2 wherein the second winding and the third winding of the second inductor coil are configured such that the first mutual magnetic coupling cancels the second mutual magnetic coupling.

4. The RF filter of claim 3 wherein:
the first inductor coil is further configured to generate an electric flux in response to the RF signal; and
the first inductor coil is further configured to have a mutual electric coupling with the second inductor coil such that the electric flux transfers the RF signal to the second inductor coil.

5. The RF filter of claim 1 wherein the first inductor coil and the second inductor coil have a third mutual magnetic coupling that is an aggregate that includes the first mutual magnetic coupling and the second mutual magnetic coupling.

6. The RF filter of claim 5 wherein:
the first inductor coil and the second inductor coil further have a mutual electric coupling; and
the first inductor coil is configured to transfer an RF signal to the second inductor coil as a result of both the third mutual magnetic coupling and the mutual electric coupling.

7. The RF filter of claim 5 wherein the second inductor coil is configured such that the third mutual magnetic coupling is not cancelled.

8. The RF filter of claim 7 wherein the first inductor coil is configured to transfer an RF signal to the second inductor coil as a result of the third mutual magnetic coupling.

9. The RF filter of claim 5 wherein the second inductor coil is configured such that the third mutual magnetic coupling is cancelled.

10. The RF filter of claim 9 wherein:
the first inductor coil and the second inductor coil further have a mutual electric coupling; and
the first inductor coil is configured to transfer an RF signal to the second inductor coil as a result of the mutual electric coupling.

11. The RF filter of claim 1 further comprising a variable capacitive element connected to the first inductor coil.

12. The RF filter of claim 1 further comprising a variable capacitive element connected to the second inductor coil.

13. The RF filter of claim 1 wherein the second inductor coil is configured such that an RF signal propagates in a first rotational direction along the second winding and in a second rotational direction along the third winding, wherein the first rotational direction is opposite to the second rotational direction.

14. The RF filter of claim 1 wherein:
the second winding is wound in a first rotational direction; and
the third winding is wound in a second rotational direction that is opposite of the first rotational direction.

15. The RF filter of claim 1 wherein:
the fourth winding has a third mutual magnetic coupling with the first winding of the first inductor coil;
the fifth winding has a fourth mutual magnetic coupling with the first winding of the first inductor coil; and
the second winding, the third winding, the fourth winding, and the fifth winding are connected such that the first mutual magnetic coupling and the third mutual magnetic coupling are in opposition to the second mutual magnetic coupling and the fourth mutual magnetic coupling.

16. The RF filter of claim 1 wherein:
the second winding has a third mutual magnetic coupling to the fourth winding;
the third winding has a fourth mutual magnetic coupling to the fourth winding; and
the second winding and the third winding are connected such that the first mutual magnetic coupling and the third mutual magnetic coupling are in opposition to the second mutual magnetic coupling and the fourth mutual magnetic coupling.

17. The RF filter of claim 1 wherein:
the first winding defines a plane and has a perimeter;
the second winding is configured such that a first projection of the second winding onto the plane is within the perimeter of the first winding; and
the third winding is configured such that a second projection of the third winding onto the plane is within the perimeter of the first winding.

18. The RF filter of claim 17 wherein the second winding and the third winding are in the plane defined by the first winding and within the perimeter of the first winding.

19. The RF filter of claim 17 wherein the second winding and the third winding define a second plane that is substantially parallel and below the plane defined by the first winding.

* * * * *

UNITED STATES PATENT AND TRADEMARK OFFICE
CERTIFICATE OF CORRECTION

PATENT NO. : 10,320,339 B2  
APPLICATION NO. : 15/972917  
DATED : June 11, 2019  
INVENTOR(S) : Leipold et al.

Page 1 of 1

It is certified that error appears in the above-identified patent and that said Letters Patent is hereby corrected as shown below:

In the Specification

Column 13, Line 60, replace "one another and thus share components)" with --one another (and thus share components)--.
Column 15, Lines 62 and 63, replace "$G_{initial}G_{intermediate}$" with --$G_{initial}*G_{intermediate}$--.
Column 16, Line 8, replace "$G_{initial}G_{intermediate}$" with --$G_{initial}*G_{intermediate}$--.
Column 16, Lines 18 and 19, replace "$(G_{initial}G_{intermediate}G_{final})$" with --$(G_{initial}*G_{intermediate}*G_{final})$--.
Column 16, Line 25, replace "of embodiment" with --alternative embodiment--.
Column 16, Line 50, replace "final stage phase control block 901" with --final stage phase control block 90I--.
Column 19, Line 65, replace "final stage phase control block 901" with --final stage phase control block 90I--.
Column 20, Lines 3, 7, and 16, replace "901" with --90I--.
Column 30, Line 40, replace "the 0 number" with --the O number--.

Signed and Sealed this  
Twenty-third Day of July, 2019

Andrei Iancu  
*Director of the United States Patent and Trademark Office*